(12) United States Patent
Higashibata et al.

(10) Patent No.: US 8,472,197 B2
(45) Date of Patent: Jun. 25, 2013

(54) RESIN-SEALED ELECTRONIC CONTROL DEVICE AND METHOD OF FABRICATING THE SAME

(75) Inventors: Shinji Higashibata, Chiyoda-ku (JP);
Shozo Kanzaki, Chiyoda-ku (JP);
Hiroyoshi Nishizaki, Chiyoda-ku (JP);
Fumiaki Arimai, Chiyoda-ku (JP);
Mikihiko Suzuki, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 189 days.

(21) Appl. No.: 12/854,503

(22) Filed: Aug. 11, 2010

(65) Prior Publication Data
US 2011/0205706 A1    Aug. 25, 2011

(30) Foreign Application Priority Data
Feb. 25, 2010    (JP) .................. 2010-040566

(51) Int. Cl.
*H05K 7/20* (2006.01)
*H01R 43/00* (2006.01)
*F28F 7/00* (2006.01)

(52) U.S. Cl.
USPC ............. 361/722; 29/825; 257/706; 257/713; 165/80.2; 165/185; 361/704; 361/707; 361/714

(58) Field of Classification Search
USPC .................................................. 361/721–722
See application file for complete search history.

(56) References Cited

U.S. PATENT DOCUMENTS

| 4,631,636 | A | * | 12/1986 | Andrews ....................... 361/699 |
| 4,901,203 | A | * | 2/1990 | Kobayashi et al. ........... 361/737 |
| 5,199,164 | A | * | 4/1993 | Kim et al. ....................... 29/840 |
| 5,199,165 | A | * | 4/1993 | Crawford et al. ............... 29/846 |
| 5,218,516 | A | * | 6/1993 | Collins et al. ................. 361/721 |
| 5,633,783 | A | * | 5/1997 | Yamamoto .................... 361/704 |
| 5,748,452 | A | * | 5/1998 | Londa ........................... 361/790 |
| 5,768,104 | A | * | 6/1998 | Salmonson et al. .......... 361/704 |

(Continued)

FOREIGN PATENT DOCUMENTS

| CN | 101477979 A | 7/2009 |
| EP | 1 460 688 A2 | 9/2004 |
| JP | 2004-281722 A | 10/2004 |
| JP | 2006-135361 A | 5/2006 |

OTHER PUBLICATIONS

Chinese Office Action dated Jan. 31, 2013, issued in corresponding Chinese Patent Application No. 201010574000.4.

(Continued)

*Primary Examiner* — Gregory Thompson
(74) *Attorney, Agent, or Firm* — Sughrue Mion, PLLC

(57) ABSTRACT

Provided is a small and low-cost resin-sealed electronic control device including a first electronic board and a second electronic board respectively bonded onto an upper surface and a lower surface of a support plate, each of the first electronic board and the second electronic board having an increased mounting area on which circuit components are mounted. A first electronic board (30A) and a second electronic board (40A) respectively bonded onto an upper surface and a lower surface of a support plate (20A) include outer circuit components (31, 41) and inner circuit components (33, 43) respectively mounted on outer surfaces and inner surfaces thereof. The inner circuit components (33, 43) are fitted into a window hole portion (21) of the support plate (20A) and are sealed with a filler (25).

11 Claims, 12 Drawing Sheets

U.S. PATENT DOCUMENTS

| | | | | |
|---|---|---|---|---|
| 6,765,285 | B2* | 7/2004 | Shinohara et al. | 257/678 |
| 7,742,307 | B2* | 6/2010 | Ellsworth et al. | 361/720 |
| 7,751,194 | B2* | 7/2010 | Sakamoto et al. | 361/719 |
| 7,772,709 | B2* | 8/2010 | Ueda et al. | 257/787 |
| 7,848,104 | B2* | 12/2010 | Shinohara | 361/695 |
| 2004/0212965 | A1 | 10/2004 | Ishii et al. | |
| 2006/0133040 | A1* | 6/2006 | Belady et al. | 361/704 |
| 2008/0304237 | A1* | 12/2008 | Shiraishi | 361/702 |
| 2009/0086431 | A1* | 4/2009 | Sakamoto et al. | 361/695 |
| 2009/0121326 | A1 | 5/2009 | Kim et al. | |

OTHER PUBLICATIONS

German Office Action dated Mar. 4, 2013, issued in corresponding German Patent Application No. 10 2010 047 646.3.

* cited by examiner

OUTER SURFACE

INNER SURFACE

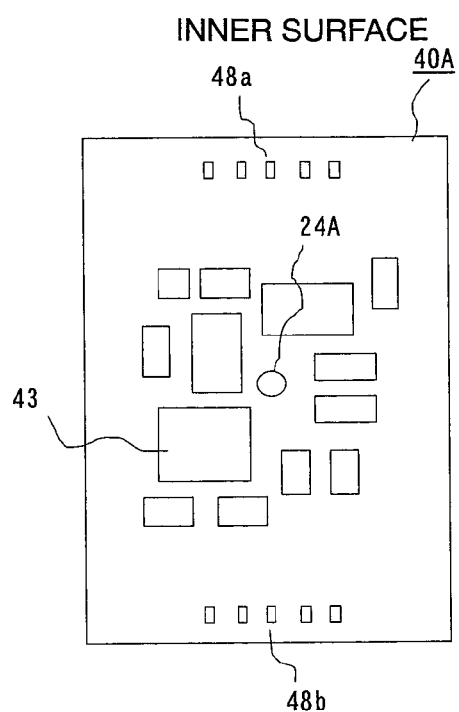
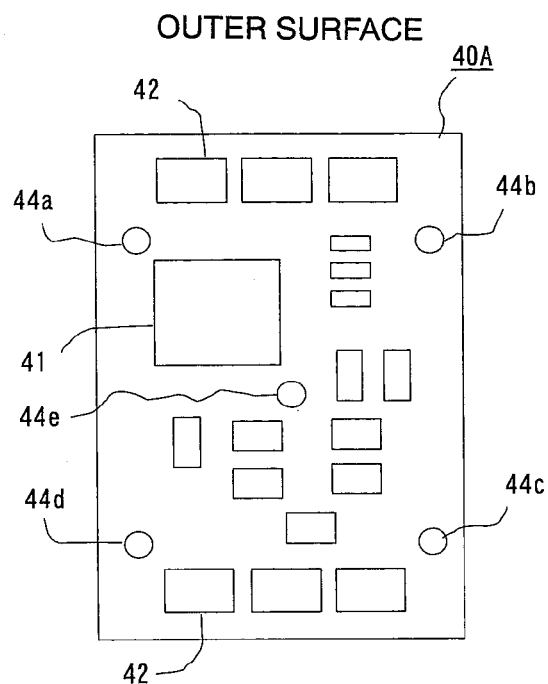
FIG. 6A INNER SURFACE
FIG. 6B OUTER SURFACE
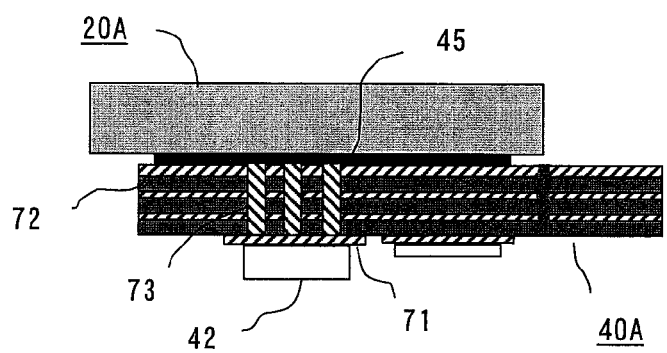
FIG. 7

OUTER SURFACE

INNER SURFACE

INNER SURFACE

OUTER SURFACE

OUTER SURFACE

INNER SURFACE

INNER SURFACE

OUTER SURFACE

RESIN-SEALED ELECTRONIC CONTROL DEVICE AND METHOD OF FABRICATING THE SAME

BACKGROUND OF THE INVENTION

1. Field of the Invention

The present invention relates to a resin-sealed electronic control device suitable, for example, as an on-vehicle electronic control device, and a method of fabricating the same.

2. Description of the Related Art

As a control device for an automobile transmission, an integrated resin-sealed electronic control device mounted inside the transmission is widely put into practical use. The on-vehicle electronic control device as described above includes any one of a ceramic board and a polyimide board bonded to a support plate serving as a thermal diffuser plate. The entire on-vehicle electronic control device except for a part of external connection terminals and a part of the support plate is integrally formed with a thermosetting resin.

For example, the invention entitled "Electronic Circuit Apparatus and Method of Manufacturing the Same", which is described in Japanese Patent Application Laid-open No. 2004-281722 (FIG. 1 and Abstract), discloses a resin-sealed electronic circuit apparatus with a high heat-dissipating property and a high packaging density in applications where high hermetic-sealing property and durability are required. In the electronic circuit apparatus, at least two wiring boards, on which electronic components are mounted, are fixedly bonded to a highly thermally conductive thermal diffuser plate through an intermediation of an adhesive. The entire wiring boards, the entire thermal diffuser plate, and a part of an external connection terminal are hermetically sealed by and integrally molded with a thermosetting resin composition. In this manner, the small and highly reliable electronic circuit apparatus can be provided at low cost.

Specifically, the aforementioned electronic circuit apparatus includes: a multilayered wiring board on which at least two electronic components are mounted; a polyimide wiring board on which heating elements are mounted; the thermal diffuser plate having a higher thermal conductivity than those of the multilayered wiring board and the polyimide wiring board; and an external connection terminal. The electronic circuit apparatus is a control unit for an automobile, which has the following structure. The multilayered wiring board is fixedly bonded to one surface of the thermal diffuser plate through an intermediation of the adhesive, whereas the polyimide wiring board is fixedly bonded to the other surface of the thermal diffuser plate through an intermediation of an adhesive. The polyimide wiring board is bent to be fixedly bonded so that an upper surface and a lower surface of the thermal diffuser plate are connected to each other. In this manner, the polyimide wiring board and the multilayered wiring board are electrically connected to each other. The multilayered wiring board, the polyimide wiring board, and the external connection terminal are electrically connected to each other. The entire surface of the multilayered wiring board, the entire surface of the polyimide wiring board, a part of the thermal diffuser plate, and a part of the external connection terminal are integrally molded with the thermosetting resin composition. The multilayered wiring board and the polyimide wiring board, and the external connection terminal are connected to each other by a bonding wire.

In the invention entitled "Electronic Circuit Apparatus and Method of Manufacturing the Same" described in Japanese Patent Application Laid-open No. 2004-281722 cited above, the wiring board is divided into two pieces so as to be fixedly bonded onto two surfaces of the thermal diffuser plate. As a result, an area of the wiring board is halved, while the heat-dissipating property is improved. The polyimide wiring board (flexible board) is used as one of the wiring boards so that the polyimide wiring board is bent to be connected to the ceramic board which is the other board.

However, each of the wiring boards is a one-sided board for bonding to the thermal diffuser plate. Therefore, in order to ensure an area on which the circuit components are mounted, the area of each of the wiring boards is disadvantageously increased.

Moreover, if the area of each of the wiring boards is large, there is another problem in that the wiring board is likely to be separated from a molded exterior covering material with repeating changes in temperature due to a difference in linear expansion coefficient.

SUMMARY OF THE INVENTION

The present invention has been made to solve the problems described above, and therefore it is an object of the present invention to provide a small and low-cost resin-sealed electronic control device in which at least one of two electronic boards corresponding to wiring boards respectively bonded to two surfaces of a support plate serving as a heat diffuser plate is a double-sided mounting board so as to increase an area on which circuit components are mounted.

The present invention has another object to provide a method of fabricating the resin-sealed electronic control device, which is devised so that the electronic boards including at least one double-sided mounting board described above are not deformed under a molding pressure.

According to the present invention, a resin-sealed electronic control device includes: a first electronic board and a second electronic board, each carrying a plurality of circuit components mounted thereon and each being electrically connected to a plurality of external connection terminals; a thermally conductive support plate including an upper surface and a lower surface, on which the first electronic board and the second electronic board are respectively bonded to be fixed; and an exterior covering material obtained by entirely covering the first electronic board and the second electronic board and partially covering the plurality of external connection terminals and the support plate with a synthetic resin, in which:

the support plate includes: a window hole portion to be filled with a viscous fluid filler; and an exposed retaining portion formed on at least one of two sides of the window hole portion to be externally exposed;

the plurality of circuit components are mounted on both an upper surface and a lower surface of at least one of the first electronic board and the second electronic board, and one of the first electronic board and the second electronic board includes a through hole for filling the window hole portion with the filler; and the first electronic board and the second electronic board respectively include peripheral edge portions on inner surfaces, which are respectively bonded to be fixed to the upper surface and the lower surface of the support plate by adhesives, and inner circuit components mounted on the inner surface of at least one of the first electronic board and the second electronic board are housed in the window hole portion.

According to the present invention, a method of fabricating the resin-sealed electronic control device includes a resin molding step of injecting the melted synthetic resin between dies for pressure-molding of the exterior covering material after connecting the first electronic board and the second electronic board to each other, connecting the plurality of external connection terminals, filling the window hole portion with the filler to then heat and cure the filler.

According to the resin-sealed electronic control device of the present invention, the support plate includes the window hole portion filled with the viscous fluid filler and the exposed retaining portion which is formed on at least one of two sides of the window hole portion so as to be externally exposed. At least one of the first electronic board and the second electronic board carries the circuit components mounted on the two surfaces thereof and is provided with the through hole for filling the window hole portion with the filler.

The peripheral edge portions of the respective inner surfaces of the first electronic board and the second electronic board are respectively bonded to be fixed to the upper surface and the lower surface of the support plate by the adhesives. The inner circuit components mounted on the inner surfaces of the first electronic board and the second electronic board are housed within the window hole portion.

Therefore, the arrangement of the inner circuit components mounted on the two inner surfaces of the first electronic board and the second electronic board in the window hole portion increases a mounting area without increasing a thickness size of the electronic control device as a whole. As a result, a plane area and a volume of the entire product can be prevented from increasing.

Moreover, the window hole portion is filled with the filler so as to provide a non-hollow structure. As a result, the electronic boards can be prevented from being deformed at the time of pressure-molding of the synthetic resin. In addition, the separation of solders from the mounted circuit components and the separation between the electronic boards and the support plate or the exterior covering material can be prevented from occurring due to expansion and shrinkage of air, which occur with a change in environmental temperature during actual use.

Further, the method of fabricating the resin-sealed electronic control device according to the present invention includes the resin molding step of injecting the melted synthetic resin between the dies for pressure-molding of the exterior covering material after the connection between the first electronic board and the second electronic board, the connection of the plurality of external connection terminals, and filling the window hole portion with the filler to then heat and cure the filler. Therefore, the adhesives, which bond the first electronic board and the second electronic board and the support plate to each other, and the filler are not melted and softened by the heat of the melted synthetic resin at the time of pressure-molding. Thus, the first electronic board, the second electronic board, the support plate, and the circuit components are reliably integrated.

BRIEF DESCRIPTION OF THE DRAWINGS

In the accompanying drawings:

FIG. 6A is a view illustrating an inner surface of a second electronic board of the resin-sealed electronic control device illustrated in FIG. 1, and FIG. 6B is a view illustrating an outer surface of the second electronic board;

FIG. 7 is a sectional view illustrating a structure in which the heat-generating components are mounted on the second electronic board;

DETAILED DESCRIPTION OF THE PREFERRED EMBODIMENTS

Hereinafter, a resin-sealed electronic control device according to each embodiment of the present invention is described with reference to the drawings. In each of the drawings, the same or equivalent members and portions are denoted by the same reference symbols for description.

First Embodiment

Figure 1:
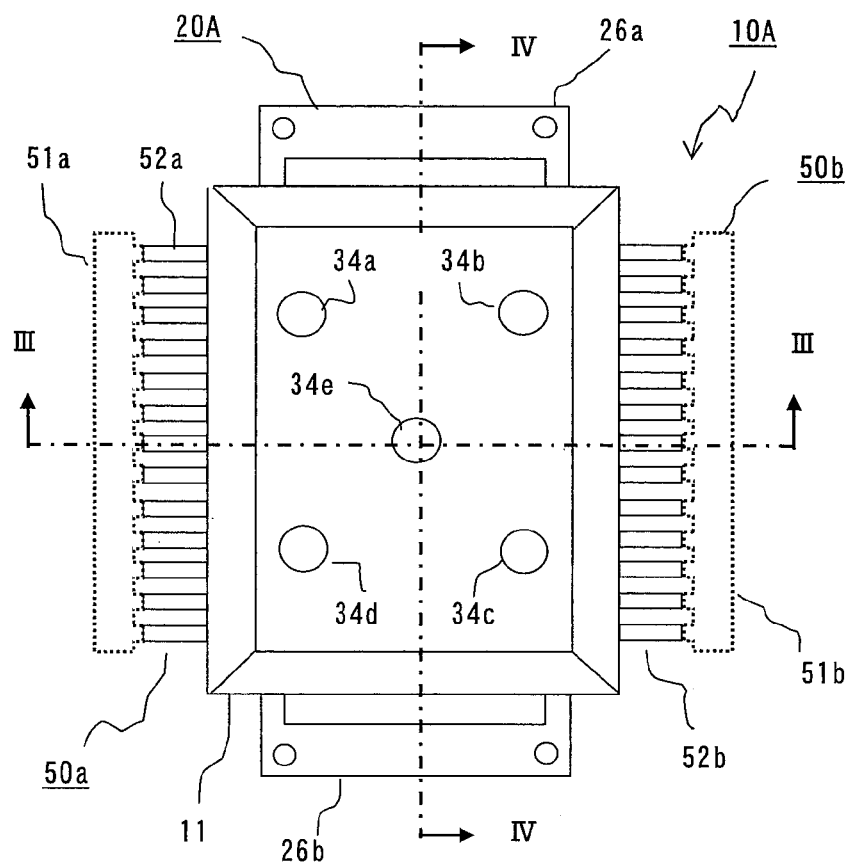
FIG. 1 is a top view illustrating a resin-sealed electronic control device according to a first embodiment of the present invention.
Figure 2:
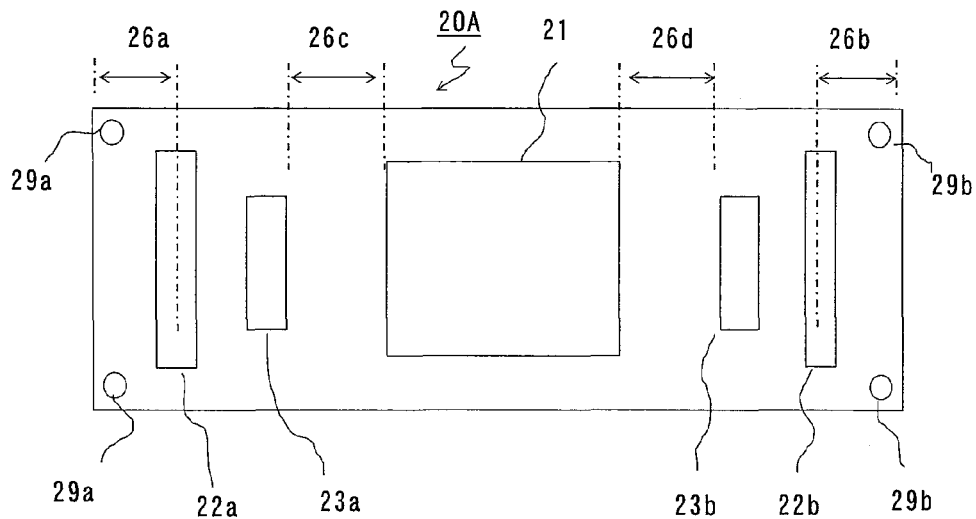
FIG. 2 is a plan view illustrating a support plate illustrated in FIG. 1.
Figure 3:
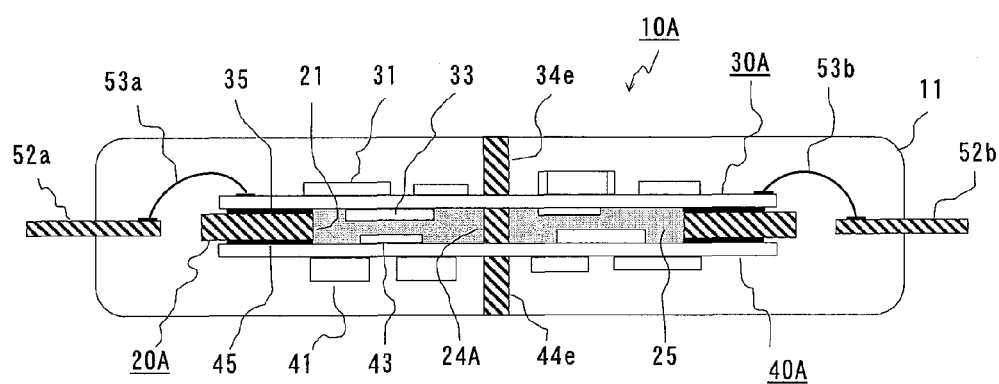
FIG. 3 is a sectional view of the resin-sealed electronic control device illustrated in FIG. 1, taken along the line III-III.
Figure 4:
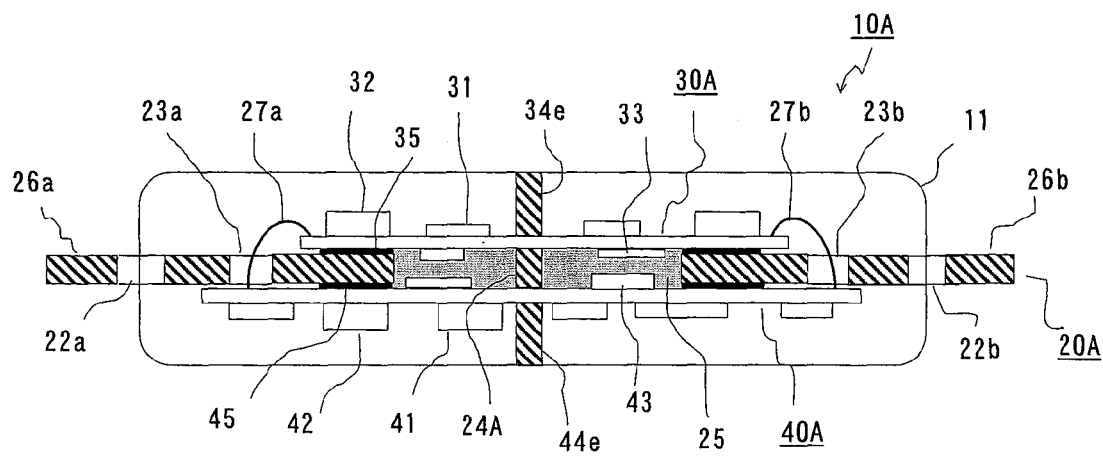
FIG. 4 is a sectional view of the resin-sealed electronic control device illustrated in FIG. 1, taken along the line IV-IV.
Figure 5A:
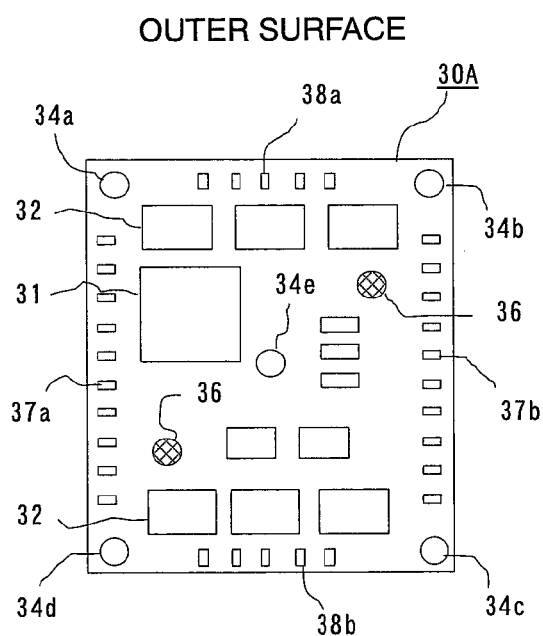
FIG. 5A is a view illustrating an outer surface of a first electronic board of the resin-sealed electronic control device illustrated in FIG. 1.
Figure 5B:
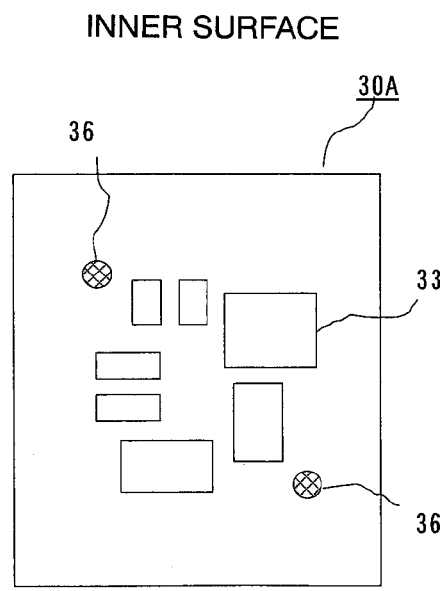
FIG. 5B is a view illustrating an inner surface of the first electronic board.

FIG. 1 is a top view illustrating a resin-sealed electronic control device (hereinafter, abbreviated as "electronic control device") 10A according to a first embodiment of the present invention. FIG. 2 is a plan view illustrating a support plate 20A illustrated in FIG. 1. FIG. 3 is a sectional view of the electronic control device 10A illustrated in FIG. 1, taken along the line III-III. FIG. 4 is a sectional view of the electronic control device 10A illustrated in FIG. 1, taken along the line IV-IV. FIG. 5A is a view illustrating an outer surface of a first electronic board 30A of the electronic control device 10A illustrated in FIG. 1, whereas FIG. 5B is a view illustrating an inner surface of the first electronic board 30A. FIG. 6A is a view illustrating an inner surface of a second electronic board 40A of the electronic control device illustrated in FIG. 1, whereas FIG. 6B is a view illustrating an outer surface of the second electronic board 40A.

The electronic control device 10A is a transmission control device for an automobile transmission and includes: the support plate 20A; the first electronic board 30A; the second electronic board 40A; a plurality of external connection terminals 52a and 52b; and an exterior covering material 11. The support plate 20A is a thermally conductive metal plate member. The first electronic board 30A is bonded to be fixed to an upper surface of the support plate 20A, whereas the second electronic board 40A is bonded to be fixed to a lower surface of the support plate 20A. The first electronic board 30A and the second electronic board 40A are connected to each other through an intermediation of bonding wires 27a and 27b, each being a board-to-board connection wiring. The plurality of external connection terminals 52a and 52b are connected to the first electronic board 30A through an intermediation of bonding wires 53a and 53b which are connection wires. The exterior covering material 11 is made of a thermosetting resin which entirely covers the first electronic board 30A, the second electronic board 40A, all of the bonding wires 27a, 27b, 53a, and 53b and partially covers the support plate 20A and the external connection terminals 52a and 52b.

Two end portions of the support plate 20A are exposed retaining portions 26a and 26b which are not covered with the exterior covering material 11. The support plate 20A is fixed to a thermally conducive wall body (not shown) through an intermediation of the exposed retaining portions 26a and 26b.

The plurality of external connection terminals 52a are initially connected to each other by a cutout connection portion 51a to constitute a terminal-group plate 50a, whereas the plurality of external connection terminals 52b are initially connected to each other by a cutout connection portion 51b to constitute a terminal-group plate 50b. By cutting out the cutout connection portions 51a and 51b in the final step of assembly, the plurality of external connection terminals 52a and 52b are separated into individual pieces.

The support plate 20A has a window hole portion 21 formed in the center. A wiring slit 23a and a boundary slit 22a are formed on the left of the window hole portion 21, whereas a wiring slit 23b and a boundary slit 22b are formed on the right of the window hole portion 21.

A portion of the support plate 20A, which is situated on the outer side of a center line of the boundary slit 22a, is the exposed retaining portion 26a which is not covered with the exterior covering material 11, whereas a portion of the support plate 20A, which is situated on the outer side of a center line of the boundary slit 22b, is the exposed retaining portion 26b which is not covered with the exterior covering material 11. Mounting holes 29a for mounting and fixing the support plate 20A onto the wall body are formed in the exposed retaining portion 26a, whereas mounting holes 29b for mounting and fixing the support plate 20A onto the wall body are formed in the exposed retaining portion 26b.

The wiring slit 23a is a window hole through which the bonding wires 27a for electrically connecting the first electronic board 30A and the second electronic board 40A to each other pass, whereas the wiring slit 23b is a window hole through which the bonding wires 27b for electrically connecting the first electronic board 30A and the second electronic board 40A to each other pass.

A portion between the wiring slit 23a and the window hole portion 21 located in the center of the support plate 20A is a plane portion 26c, whereas a portion between the wiring slit 23b and the window hole portion 21 is a plane portion 26d. Heat-generating components 32 are mounted on outer surfaces of areas of the first electronic board 30A, the areas being respectively opposed to upper surfaces of the plane portions 26c and 26d, whereas heat-generating components 42 are mounted on outer surfaces of areas of the second electronic board 40A, the areas being respectively opposed to lower surfaces of the plane portions 26c and 26d.

The first electronic board 30A is bonded to be fixed onto an upper surface of the support plate 20A by an adhesive 35, whereas the second electronic board 40A is bonded to be fixed onto a lower surface of the support plate 20A by an adhesive 45. Each of the first electronic board 30A and the second electronic board 40A is, for example, a glass epoxy board.

The first electronic board 30A is a double-sided mounting board. As illustrated in FIG. 5A, a plurality of outer circuit components 31 are soldered onto soldering lands provided on an outer surface of the first electronic board 30A. As illustrated in FIG. 5B, a plurality of inner circuit components 33 are soldered onto soldering lands provided on an inner surface of the first electronic board 30A.

The inner circuit components 33 mounted on the inner surface of the first electronic board 30A, which is a surface to be bonded to the support plate 20A, are housed within the window hole portion 21 formed in the support plate 20A.

As in the case of the first electronic board 30A, a plurality of outer circuit components 41 and a plurality of inner circuit components 43 are respectively mounted on an outer surface and an inner surface of the second electronic board 40A. The inner circuit components 43 are housed in the window hole portion 21 formed in the support plate 20A.

First spacers 34a, 34b, 34c, and 34d are fixed by soldering in the four corners of the first electronic board 30A, as illustrated in FIG. 5A. A first spacer 34e is fixed by soldering in the center of the first electronic board 30A.

Each of the first spacers 34a to 34e passes through the exterior covering material 11 so that a distal end surface of each of the first spacers 34a to 34e is externally exposed.

Similarly, second spacers 44a, 44b, 44c, and 44d are fixed by soldering at four positions on the second electronic board 40A, as illustrated in FIG. 6B. A second spacer 44e is fixed by soldering in the center of the second electronic board 40A.

Each of the second spacers 44a to 44e passes through the exterior covering material 11 so that a distal end surface of each of the second spacers 44a to 44e is externally exposed.

A third spacer 24A is fixed by soldering in the center of the second electronic board 40A, as illustrated in FIG. 6A. A distal end surface of the third spacer 24A is brought into contact with the inner surface of the first electronic board 30A.

The third spacer 24A may be fixed onto the inner surface of the first electronic board 30A.

The spacers 34a to 34e, 44a to 44e, and 24A serve as reinforcing members for preventing the first electronic board 30A and the second electronic board 40A from being deformed at the time of heat-molding of the exterior covering material 11.

The window hole portion 21 of the support plate 20A is filled with a filler 25. The filler 25 is a viscous fluid potting resin material injected into the window hole portion 21 through a through hole 36 formed in the first electronic board 30A.

As a method of filling the filler 25, the following method may be used. The second electronic board 40A is first bonded to be fixed onto the lower surface of the support plate 20A. Subsequently, an appropriate amount of the filler 25 is applied to the window hole portion 21 of the second electronic board 40A. Then, the first electronic board 30A is pressed against the upper surface of the support plate 20A so that an excessive amount of the applied filler 25 is leaked out through the through hole 36.

Board-to-board connection lands 38a are provided in one shorter-side edge area of the outer surface of the first electronic board 30A, whereas board-to-board connection lands 38b are provided in the other shorter-side edge area, which is opposite to the shorter-side edge area in which the board-to-board connection lands 38a are provided.

Terminal connection lands 37a are provided in one longer-side edge area of the outer surface of the first electronic board 30A, whereas terminal connection lands 37b are provided in the other longer-side edge area, which is opposite to the longer-side edge area in which the terminal connection lands 37a are provided.

Board-to-board connection lands 48a are provided in one shorter-side edge area of the inner surface of the second electronic board 40A, whereas board-to-board connection lands 48b are provided in the other shorter-side edge area, which is opposite to the shorter-side edge area in which the board-to-board connection lands 48a are provided.

The first electronic board 30A, which is bonded to be fixed onto the upper surface of the support plate 20A, and the second electronic board 40A, which is bonded to be fixed onto the lower surface of the support plate 20A, are connected to each other by the bonding wires 27a passing through the wiring slit 23a on one side and the bonding wires 27b passing through the wiring slit 23b on the other side.

Specifically, one end of each of the bonding wires 27a is connected to a corresponding one of the board-to-board connection lands 38a of the first electronic board 30A, whereas the other end of each of the bonding wires 27a is connected to a corresponding one of the board-to-board connection lands 48a of the second electronic board 40A.

One end of each of the bonding wires 27b is connected to a corresponding one of the board-to-board connection lands 38b of the first electronic board 30A, whereas the other end of each of the bonding wires 27b is connected to a corresponding one of the board-to-board connection lands 48b of the second electronic board 40A.

One end of each of the bonding wires 53a is connected to a corresponding one of the terminal connection lands 37a, whereas the other end of each of the bonding wires 53a is connected to a corresponding one of the external connection terminals 52a.

One end of each of the bonding wires 53b is connected to a corresponding one of the terminal connection lands 37b, whereas the other end of each of the bonding wires 53b is connected to a corresponding one of the external connection terminals 52b.

FIG. 7 is a sectional view illustrating a structure in which the heat-generating components 42 are mounted on the second electronic board 40A.

The heat-generating components 42 are mounted on an outer-surface pattern 71 of the second electronic board 40A. The outer-surface pattern 71 and an inner-surface pattern 72 are thermally connected to each other by a plurality of plated through holes 73.

The inner-surface pattern 72 is held in surface contact with the plane portion 26c (see FIG. 2) of the support plate 20A through an intermediation of the thermally conductive adhesive 45.

Small holes may be formed in the second electronic board 40A. In this case, projections integrally provided with the support plate 20A are fitted into the small holes. Heat-generating electrodes of the heat-generating components 42 are opposed to the projections. A gap between the projections and the heat-generating electrodes may be filled with a thermally conductive adhesive for heat conduction.

Figure 8:
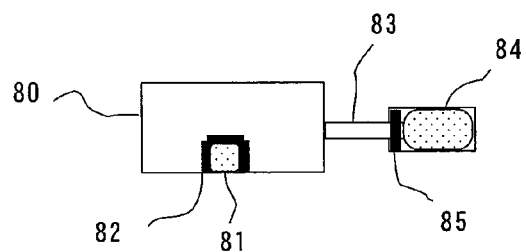
FIG. 8 is an enlarged view illustrating solder outflow-preventing walls of the resin-sealed electronic control device illustrated in FIG. 1.

FIG. 8 is an enlarged view illustrating solder outflow-preventing walls 82 and 85 provided on the upper surface and the lower surface of each of the first electronic board 30A and the second electronic board 40A.

A plane pattern 80 is formed on each of the upper surface and the lower surface of each of the first electronic board 30A and the second electronic board 40A. The solder outflow-preventing wall 82 is made of a solder resist material or an ink material for silk-screen printing to be provided around a soldering land 81 of the plane pattern 80.

Similarly, the solder outflow-preventing wall 85 is made of a solder resist material or an ink material for silk-screen printing to be provided around a soldering land 84 of a wiring pattern 83.

In the case of a general electronic board, a solder resist film is formed on the entire surface of the electronic board except for the soldering lands. However, if the solder resist film is provided on the entire surface, the adhesion to the exterior covering material 11 is degraded.

On the other hand, in this first embodiment, the solder resist film is not provided on the entire surface. Instead, the solder outflow-preventing wall 82 is provided locally. As a result, the amount of solder on the soldering lands 81 and 82 can be appropriately controlled.

Figure 9:
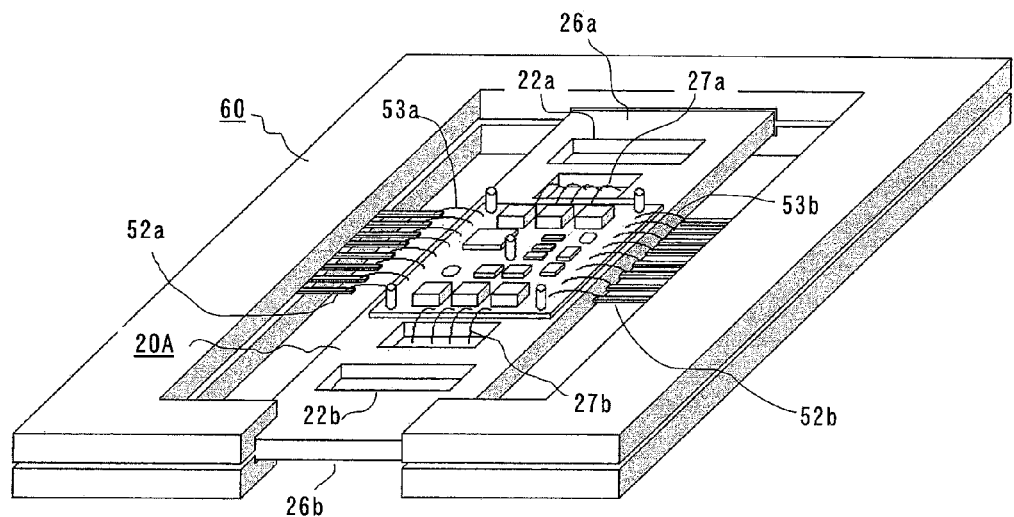
FIG. 9 is a view of the resin-sealed electronic control device temporarily assembled with a temporary fixture.

FIG. 9 is a view of the electronic control device 10A temporarily assembled with a temporary fixture 60.

The rectangular temporary fixture 60 is a fixture for temporarily fixing the cutout connection portion 51a of the terminal-group plate 50a, the cutout connection portion 51b of the terminal-group plate 50b, and the exposed retaining portions 26a and 26b of the support plate 20A. The connection of the bonding wires 53a to the external connection terminals 52a and the connection of the bonding wires 53b to the external connection terminals 52b and the molding process of the exterior covering material 11 are performed with the temporary fixture 60 mounted.

The use of the temporary fixture 60 can be omitted in the following case. The cutout connection portions 51a and 51b illustrated in FIG. 1 are respectively extended to the exposed retaining portions 26a and 26b of the support plate 20A so as to be screwed to the exposed retaining portions 26a and 26b of the support plate 20A.

Figure 10:
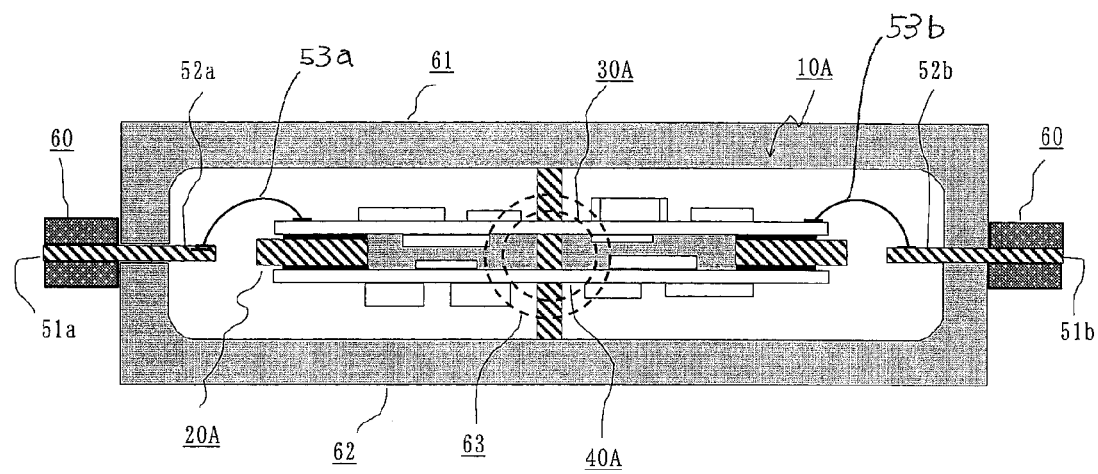
FIG. 10 is a sectional view illustrating molding dies used to fabricate the resin-sealed electronic control device illustrated in FIG. 1.

FIG. 10 is a sectional view illustrating molding dies.

An upper die 61 and a lower die 62 as the molding dies are inserted into and integrated with the temporary fixture 60 so that the inner wall surfaces of the dies 61 and 62 abut against an outer wall surface of the temporary fixture 60.

At this time, the electronic control device 10 is before being molded with the synthetic resin, and hence is not provided with the exterior covering material 11.

A resin injection port 63 is provided to the dies 61 and 62 at a position in the longitudinal direction of the support plate 20A so as to be opposed to one of the end surfaces of the support plate 20A. The heated and melted synthetic resin is injected under pressure into an internal space closed by the dies 61 and 62 through the resin injection port 63.

Next, a procedure of fabricating the electronic control device 10A according to the first embodiment is described with reference to FIG. 11.

First, in a board fabrication step 110, the first electronic board 30A and the second electronic board 40A, on which the wiring patterns, the soldering lands, and the like are provided, are fabricated.

In the board fabrication step 110, in contrast to the general electronic boards, the solder resist film is not formed on the entire surface. Instead, as illustrated in FIG. 8, only the solder outflow-preventing wall 82 for the soldering land 81 and the solder outflow-preventing wall 85 for the soldering land 84 are formed.

Next, in board mounting steps 111 and 112, various components such as the circuit components 31, 33, 41, and 43, the first spacers 34a to 34e, the second spacers 44a to 44e, and the third spacer 24A are soldered onto the first electronic board 30A and the second electronic board 40A. In addition, bonding pads for connection of the bonding wires 27a, 27b, 53a, and 53b are soldered.

In the board mounting steps 111 and 112, a solder paste is applied onto the soldering lands 81 and 84 of the first electronic board 30A and the second electronic board 40A through an intermediation of a metal mask (not shown). After being mounted on the first electronic board 30A and the second electronic board 40A, the components are soldered onto the soldering lands 81 and 84 by using a reflow solder furnace.

Each of the first electronic board 30A and the second electronic board 40A is a double-sided mounting board. The mounting of various components and the soldering thereof are performed in the same manner on the opposite surface of each of the first electronic board 30A and the second electronic board 40A.

In a subsequent board bonding step 113a, the first electronic board 30A is bonded to the upper surface of the support plate 20A by using the adhesive 35, whereas the second electronic board 40A is bonded to the lower surface of the support plate 20A by using the adhesive 45.

In a board bonding step 113b replacing the board bonding step 113a, the following process may alternatively be performed. The second electronic board 40A is first bonded to be fixed to the lower surface of the support plate 20A by using the adhesive 35. Thereafter, the filler 25 is applied to the window hole portion 21 of the support plate 20A. Subsequently, the first electronic board 30A is bonded to be fixed to the upper surface of the support plate 20A. A small amount of the filler 25 may be leaked out through the through hole 36 provided in the first electronic board 30A at this time.

In the board bonding step 113a, the adhesives 35 and 45 are heated to be cured. Then, the process may proceed to the next step. Alternatively, in the board bonding step 113a, the first electronic board 30A and the second electronic board 40A are prevented from slipping off by a clip (not shown) which serves as a temporary fixture. Then, in a window hole filling step 116a described below, the adhesives 35 and 45 may be heated and cured simultaneously with the heating and curing of the filler 25.

In a connection wiring step 114a subsequent to the board bonding step 113a, the terminal-group plates 50a and 50b and the support plate 20A are integrated with each other by the temporary fixture 60 as illustrated in FIG. 9. In a subsequent connection wiring step 115, the first electronic board 30A and the second electronic board 40A are connected to each other by using the bonding wires 27a and 27b. In addition, the first electronic board 30A is connected to the external connection terminals 52a and 52b by using the bonding wires 53a and 53b.

A connection wiring step 114b may be performed in place of the connection wiring step 114a. In the connection wiring step 114b, the terminal-group plate 50a is screwed to the exposed retaining portion 26a of the support plate 20A, whereas the terminal group plate 50b is screwed to the exposed retaining portion 26b of the support plate 20A, without using the temporary fixture 60.

In a subsequent window-hole filling step 116a, the filler 25 is injected into the window hole portion 21 from the through hole 36 provided in the first electronic board 30A which is bonded to be fixed to the support plate 20A together with the second electronic board 40A in the board bonding step 113a. Then, the filler 25 is heated to be dried.

When the board bonding step 113b is used in place of the board bonding step 113a, the window-hole filling step 116a is not required because the window hole portion 21 is already filled with the filler 25 in the board bonding step 113b.

In a subsequent resin molding step 117, the support plate 20A, which is integrated with the group-terminal plates 50a and 50b, is placed inside the molding dies 61 and 62. Then, the heated and melted synthetic resin is injected from the resin injection port 63 so that the exterior covering material 11 is molded to cover the support plate 20A, the first electronic board 30A, and the second electronic board 40A.

The used synthetic resin may be any one of a thermosetting resin and a thermoplastic resin.

In a subsequent post-processing step 118, the temporary fixture 60 is dismounted and the cutout connection portions 51a and 51b are cut out to separate the external connection terminals 52a and 52b into individual pieces so that the resin-sealed electronic board device 10A is obtained.

In a subsequent inspection and test step 119, the product is inspected for external shape and size, and performance. Thereafter, a finished product is obtained.

For bonding the first and second electronic boards onto the support plate 20A in the board bonding step 113a or 113b, the adhesives made of a thermosetting resin which is, for example, a silicon resin composition are used.

For filling the window hole portion in the window-hole filling step 116a or 116b, a potting material made of a thermosetting resin which is, for example, as a silicon resin composition is used.

As the thermosetting resin described above, there is selected a thermosetting resin with flowability, which has a viscosity at room temperature suitable as the adhesive or the filler. The thermosetting resin described above has the following characteristic. Specifically, the thermosetting resin is not melted and softened by re-heating once cured by heating at a temperature of, for example, 150° C. or lower.

The thermosetting resin used in the resin molding step 117, which is, for example, an epoxy resin composition, has the same characteristic as that of the aforementioned thermosetting resin. Specifically, the thermosetting resin is pressure-molded at a temperature of, for example, 150° C. or lower, which does not cause damages to the electronic components or does not allow the solder on the electronic boards to be melted. Then, once cured by being left in a natural ambiance or by forcible cooling, the thermosetting resin is not melted and softened by re-heating.

When the thermoplastic resin is used as a synthetic resin for the exterior covering material, the thermoplastic resin is softened and melted by re-heating. Therefore, the thermoplastic resin is suitable for the disposal of the wasted parts of the product after separating the materials of the product.

As described above, according to the electronic control device 10A of this first embodiment, the first electronic board 30A and the second electronic board 40A, each being the double-sided mounting board, are bonded to the two surfaces of the thermally conductive support plate 20A having the window hole portion 21. After the connection between the first electronic board 30A and the second electronic board 40A to each other, the connection of the external connection terminals 52a and 52b to the support plate 20A, the filling of the filler 25 into the window hole portion 21, and heating and curing of the filler 25, the exterior covering material 11 is formed of the synthetic resin.

Therefore, the circuit components 31, 33, 41, and 43 mounted on the respective two surfaces of the first electronic board 30A and the second electronic board 40A can be placed in the window hole portion 21. Thus, a mounting area is increased without increasing a thickness size of the electronic control device 10A as a whole. As a result, a plane area and a volume of the entire product can be reduced.

Moreover, the window hole portion 21 is filled with the filler 25 so as to provide a non-hollow structure. Therefore, the first electronic board 30A and the second electronic board 40A can be prevented from being deformed at the time of pressure-molding of the synthetic resin in the resin molding step 117. The separation of the solders from the mounted circuit components 31, 33, 41, and 43 and the separation of the first electronic board 30A and the second electronic board 40A from the support plate 20A and the exterior covering material 11 can be prevented from occurring due to expansion and shrinkage of air along with a change in environmental temperature during actual use.

The heat-generating components 32 and 42 are mounted on the outer surfaces of the areas of the first electronic board 30A and the second electronic board 40A which are bonded to the support plate 20A by the thermally conductive adhesives 35 and 45, respectively, the inner surfaces of the areas of the first electronic board 30A and the second electronic board 40A being opposed to the plane portions 26c and 26d. In addition, the exposed retaining portions 26a and 26b of the support plate 20A are fixed to the thermally conductive wall body to which the support plate 20A is mounted.

Therefore, the heat generated from the heat-generating components 32 and 42 is conducted and diffused to the wall body through the adhesives 35 and 45 and the plane portions 26c and 26d of the support plate 20A. Thus, even if the heat-generating components 32 and 42 are respectively mounted on the first electronic board 30A and the second electronic board 40A, the product can be reduced in size.

Moreover, the first spacers 34a to 34e and the second spacers 44a to 44e, each having a size corresponding to a thickness of the exterior covering material 11, are provided in a scattered fashion on the outer surfaces of the first electronic board 30A and the second electronic board 40A, respectively.

Therefore, at the time of pressure-molding of the exterior covering material 11, the first spacers 34a to 34e provided on the first electronic board 30A abut against the inner wall surface of the upper die 61 to prevent the upward flexural deformation of the first electronic board 30A. The second spacers 44a to 44e provided on the second electronic board 40A abut against the inner wall surface of the lower die 62 to prevent the downward flexural deformation of the second electronic board 40A.

Moreover, the third spacer 24A having a size corresponding to a thickness of the support plate 20A is provided in the window hole portion 21 of the support plate 20A so as to be interposed between the first electronic board 30A and the second electronic board 40A. At the time of pressure-molding of the exterior covering material 11, the flexural deformation of the first electronic board 30A and the second electronic board 40A in a direction in which the first electronic board 30A and the second electronic board 40A are brought closer to each other, is prevented by the third spacer 24A.

As described above, the first spacers 34a to 34e, the second spacers 44a to 44e, and the third spacer 24A function as the reinforcing members. Therefore, even though each of the first electronic board 30A and the second electronic board 40A is not bonded to the support plate 20A over the entire surface, the first electronic board 30A and the second electronic board 40A can be prevented from being deformed at the time of pressure-molding of the exterior covering material 11.

The boundary slit 22a is formed in the boundary area of the support plate 20A between the exposed retaining portion 26a and the position where the exterior covering material 11 is provided, whereas the boundary slit 22b is formed in the boundary area between the exposed retaining portion 26b and the position where the exterior covering material 11 is provided. In addition, the wiring slits 23a and 23b are formed in parallel to the boundary slits 22a and 22b.

Moreover, the board-to-board connection lands 38a are provided on the side of the first electronic board 30A, which is parallel to the wiring slits 23a and 23b, whereas the board-to-board connection lands 38b are provided on the side of the first electronic board 30A, which is opposite to the side where the board-to-board connection lands 38a are provided. In the same manner, the board-to-board connection lands 48a are provided on the side of the second electronic board 40A, which is parallel to the wiring slits 23a and 23b, whereas the board-to-board connection lands 48b are provided on the side of the second electronic board 40A, which is opposite to the side where the board-to-board connection lands 48a are provided. The first electronic board 30A and the second electronic board 40A are connected to each other by the bonding wires 27a and 27b. Moreover, the plurality of terminal connection lands 37a are arranged on the side of the first electronic board 30A, which is perpendicular to the wiring slits 23a and 23b, whereas the plurality of terminal connection lands 37b are arranged on the side of the first electronic board 30A, which is opposite to the side where the plurality of terminal connection lands 37a are arranged. The terminal connection lands 37a are connected to the external connection terminals 52a by the bonding wires 53a, whereas the terminal connection lands 37b are connected to the external connection terminals 52b by the bonding wires 53b.

As described above, the boundary slits 22a and 22b and the wiring slits 23a and 23b are formed in the support plate 20A in a separate manner. The bounding wires 27a and 27b serving as the connection wires for the connection between the first electronic board 30A and the second electronic board 40A respectively pass through the wiring slits 23a and 23b to connect the first electronic board 30A and the second electronic board 40A to each other. Therefore, there is no fear in that the connection wires are exposed at the boundaries between the exposed retaining portion 26a and the exterior covering material 11 and between the exposed retaining portion 26b and the exterior covering material 11. As a result, the separation of the exterior covering material 11 from the support plate 20A becomes unlikely to occur at the boundary between the exterior covering material 11 and the support plate 20A.

Moreover, the external connection terminals 52a and 52b can be arranged in a concentrated manner only on the opposite sides which are perpendicular to the wiring slits 23a and 23b. In addition, an operation of connecting the bonding wires 53a and 53b can be performed without being hindered by the bonding wires 27a and 27b. Therefore, workability in the connection of the wires is improved.

Moreover, the terminal connection lands 37a, to which the external connection terminals 52a are connected, and the terminal connection lands 37b, to which the external connection terminals 52b are connected, are provided on the first electronic board 30A. The second electronic board 40A is connected to the first electronic board 30A through an intermediation of the bonding wires 27a and 27b serving as the board-to-board connection wiring so as to be connected to the external connection terminals 52a and 52b by the bonding wires 53a and 53b through the terminal connection lands 37a and 37b.

Therefore, a wire bonding operation is performed so that the bonding wires 53a and 53b are connected to the surfaces of the external connection terminals 52a and 52b from the first electronic board 30A side. As a result, workability is improved.

Moreover, the wire bonding operation is performed from one side. Therefore, the ends of the first electronic board 30A and the second electronic boards 40A are not required to be arranged in a step-like manner. As a result, a width size of each of the electronic boards 30A and 40A can be reduced.

Further, according to the method of fabricating the electronic control device 10A, the fabrication process of the electronic control device 10A includes: the board mounting steps 111 and 112; the board bonding step 113a or 113b; the connection wiring steps 114a or 114b and 115; the window-hole filling step 116a or 116b; the resin molding step 117; and the post-processing step 118. In this fabrication process, the exterior covering material 11 is formed of the thermosetting resin or the thermoplastic resin by integral molding after the adhesives 35 and 45 and the filler 25, each being the thermosetting resin, are heated to be cured.

Once cured, the thermosetting resin is not melted and softened by re-heating. Therefore, the support plate 20A, the first electronic board 30A, and the second electronic board 40A can be reliably integrated after the integral molding.

Moreover, for the first electric board 30A and the second electric board 40A, the solder outflow-preventing wall 82 formed of the solder resist film or by silk-screen printing is provided between the soldering land 81 and the plane pattern 80 being in connection with the soldering land 81 to prevent outflow of the melted solder. Similarly, the solder outflow-preventing wall 85 formed of the solder resist film of by silk-screen printing is provided between the soldering land 84 and the wiring pattern 83 being in connection with the soldering land 84 to prevent outflow of the melted solder. The circuit components 31, 32, 33, 41, 42, and 43 are connected to the soldering lands 81 and 84. In this manner, the solder resist film, which is conventionally applied onto the entire surface of each of the first electric board 30A and the second electric board 40A except for the soldering lands 81 and 84, is not formed.

Thus, a step of forming the solder resist film conventionally provided on the entire surface of each of the electric boards except for the soldering lands can be omitted in the board fabrication step 110. In addition, the adhesion between the exterior covering material and the first electronic board 30A and the second electronic board 40A is improved. As a result, the separation of the exterior covering material 11 can be prevented.

Second Embodiment

Figure 12:
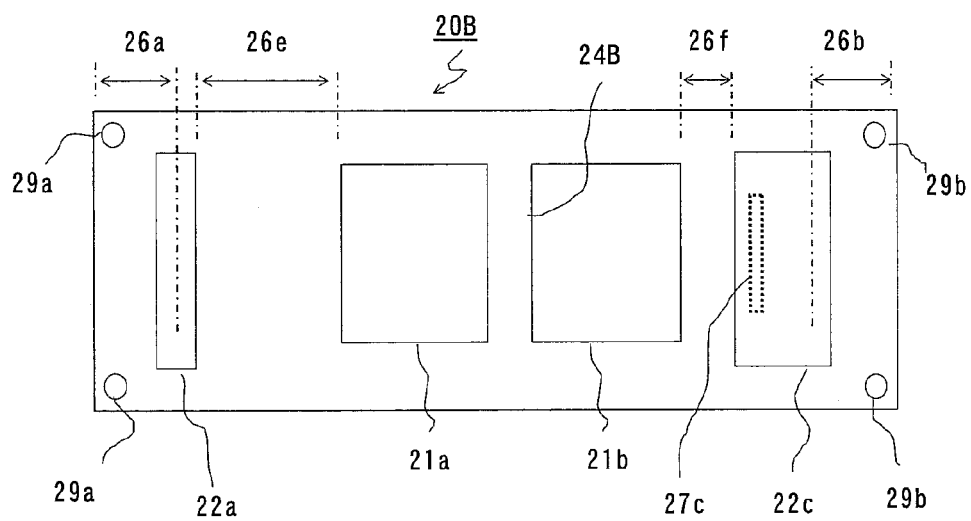
FIG. 12 is a plan view illustrating a support plate of an resin-sealed electronic control device according to a second embodiment of the present invention.
Figure 13:
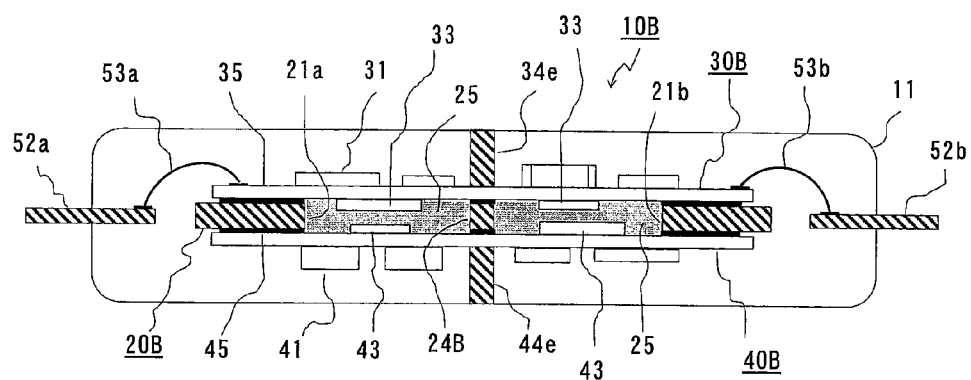
FIG. 13 is a sectional view of the resin-sealed electronic control device according to a second embodiment of the present invention, cut along a lateral direction of the support plate.
Figure 14:
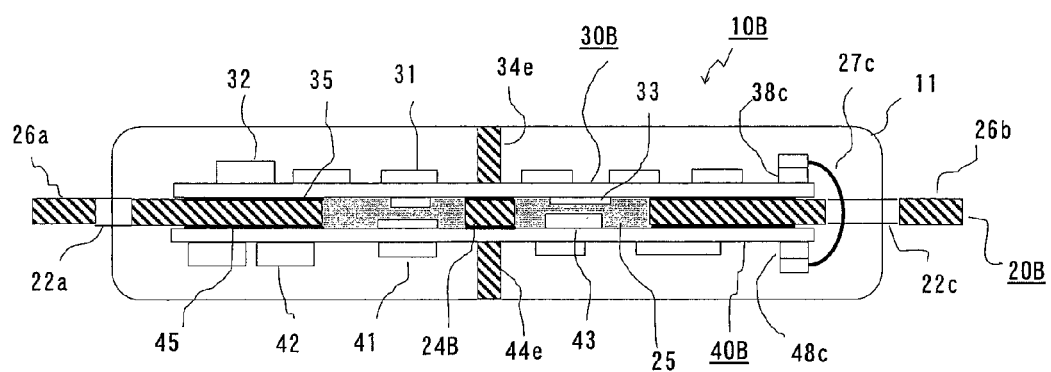
FIG. 14 is a sectional view of the resin-sealed electronic control device according to a second embodiment of the present invention, cut along a longitudinal direction of the support plate.
Figure 15A:
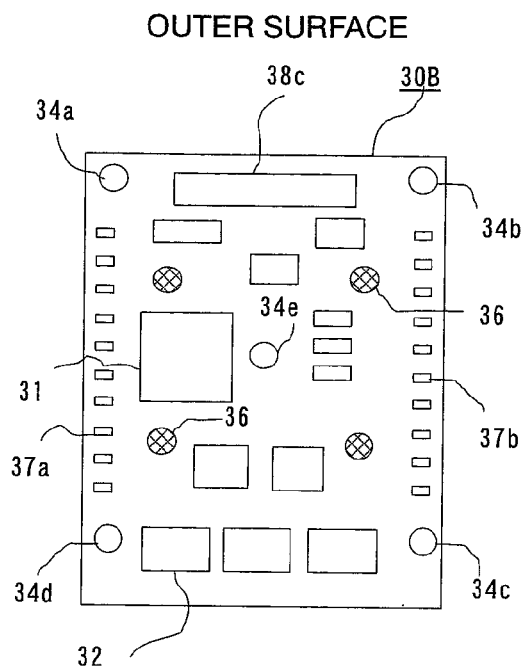
FIG. 15A is a view illustrating an outer surface of a first electronic board of the resin-sealed electronic control device.
Figure 15B:
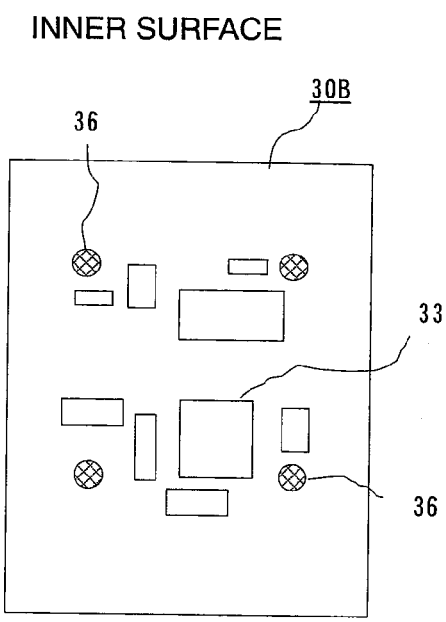
FIG. 15B is a view illustrating an inner surface of the first electronic board.
Figure 16A:
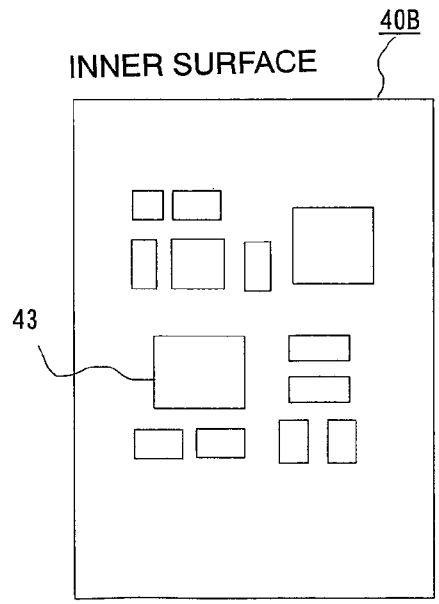
FIG. 16A is a view illustrating an inner surface of a second electronic board of the resin-sealed electronic control device.
Figure 16B:
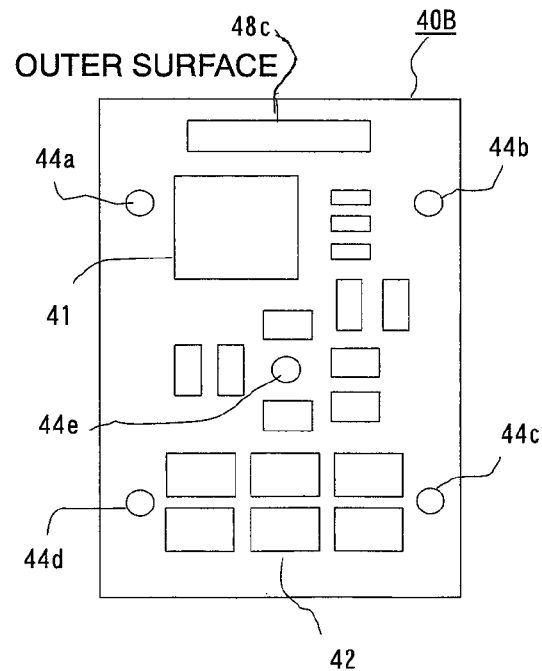
FIG. 16B is a view illustrating an outer surface of the second electronic board.

FIG. 12 is a plan view illustrating a support plate 20B of an electronic control device 10B according to a second embodiment of the present invention. FIG. 13 is a sectional view of the electronic control device 10B, cut along a lateral direction of the support plate 20B. FIG. 14 is a sectional view of the electronic control device 10B, cut along a longitudinal direction of the support plate 20B. FIG. 15A is a view illustrating an outer surface of a first electronic board 30B of the electronic control device 10B, whereas FIG. 15B is a view illustrating an inner surface of the first electronic board 30B. FIG. 16A is a view illustrating an inner surface of a second electronic board 40B of the electronic control device 10B, whereas FIG. 16B is a view illustrating an outer surface of the second electronic board 40B.

The electronic control device 10B includes: the support plate 20B; the first electronic board 30B; the second electronic board 40B; the plurality of external connection terminals 52a and 52b; and the exterior covering material 11. The support plate 20B is a thermally conductive metal plate member. The first electronic board 30B is bonded to be fixed to an upper surface of the support plate 20B, whereas the second electronic board 40B is bonded to be fixed to a lower surface of the support plate 20B. The first electronic board 30B and the second electronic board 40B are connected to each other through an intermediation of a flexible cable 27c which is a board-to-board connection wiring. The plurality of external connection terminals 52a and 52b are connected to the first electronic board 30B through an intermediation of the bonding wires 53a and 53b. The exterior covering material 11 made of a thermosetting resin entirely covers the first electronic board 30B, the second electronic board 40B, the flexible cable 27c, and all of the bonding wires 53a and 53b and partially covers the support plate 20B and the plurality of external connection terminals 52a and 52b.

The support plate 20B has a pair of window hole portions 21a and 21b which are separated from each other by a partition wall 24B. A small window serving as the boundary slit 22a is provided on the left of the window hole portion 21a, whereas a small window serving as a boundary slit 22c is provided on the right of the window hole portion 21b.

The boundary slit 22c also serves as a wiring slit through which the flexible cable 27c passes and has a larger width than that of the boundary slit 22a.

The exposed retaining portions 26a and 26b are not covered with the exterior covering material 11. The exposed retaining portion 26a is a portion situated outside a center line of the boundary slit 22a. In the same manner, the exposed retaining portion 26b is a portion situated outside a line which defines the quarter of the boundary slit 22c. The mounting holes 29a are formed in the exposed retaining portion 26a, whereas the mounting holes 29b are formed in the exposed retaining portion 26b. The exposed retaining portions 26a and 26b are formed for mounting and fixing the support plate 20B to the wall body (not shown).

The heat-generating components 32 are mounted on outer surfaces of areas of the first electronic board 30B, inner surfaces of the areas of the first electronic board 30B being respectively opposed to a plane portion 26e corresponding to a portion between the boundary slit 22a and the window hole portion 21a and a plane portion 26f corresponding to a portion between the boundary slit 22c and the window hole portion 21b. Similarly, the heat-generating components 42 are mounted on outer surfaces of areas of the second electronic board 40B, inner surfaces of the areas of the second electronic board 40B being respectively opposed to the plane portions 26e and 26f.

The first electronic board 30B is bonded to be fixed onto an upper surface of the support plate 20B by the adhesive 35, whereas the second electronic board 40B is bonded to be fixed onto a lower surface of the support plate 20B by the adhesive 45. Each of the first electronic board 30B and the second electronic board 40B is, for example, a glass epoxy board.

The first electronic board 30B is a double-sided mounting board. As illustrated in FIG. 15A, the plurality of outer circuit components 31 are soldered onto soldering lands provided on an outer surface of the first electronic board 30B. As illustrated in FIG. 15B, the plurality of inner circuit components 33 are soldered onto soldering lands provided on an inner surface of the first electronic board 30B.

The inner circuit components 33 mounted on the inner surface of the first electronic board 30B, which is a surface to be bonded to the support plate 20B, are housed within the window hole portions 21a and 21b formed in the support plate 20B.

As in the case of the first electronic board 30B, the plurality of outer circuit components 41 and the plurality of inner circuit components 43 are respectively mounted on an outer surface and an inner surface of the second electronic board 40B. The inner circuit components 43 are housed in the window hole portions 21a and 21b formed in the support plate 20B.

The first spacers 34a, 34b, 34c, and 34d are fixed by soldering in the four corners of the first electronic board 30B, as illustrated in FIG. 15A. The first spacer 34e is fixed by soldering in the center of the first electronic board 30B.

Each of the first spacers 34a to 34e passes through the exterior covering material 11 so that a distal end surface of each of the first spacers 34a to 34e is externally exposed.

Similarly, the second spacers 44a, 44b, 44c, and 44d are fixed by soldering at four positions on the second electronic board 40B, as illustrated in FIG. 16B. The second spacer 44e is fixed by soldering in the center of the second electronic board 40B.

Each of the second spacers 44a to 44e passes through the exterior covering material 11 so that a distal end surface of each of the second spacers 44a to 44e is externally exposed.

The spacers 34a to 34e, 44a to 44e, and the partition wall 24B serving as the third spacer serve as reinforcing members for preventing the first electronic board 30B and the second electronic board 40B from being deformed at the time of heat-molding of the exterior covering material 11.

The window hole portions 21a and 21b of the support plate 20B is filled with a filler 25. The filler 25 is a viscous fluid potting resin material injected into the window hole portions 21a and 21b through a through hole 36 formed in the first electronic board 30B.

As a method of filling the filler 25, the following method may be used. The second electronic board 40B is first bonded to be fixed onto the lower surface of the support plate 20B. Subsequently, an appropriate amount of the filler 25 is applied to the window hole portions 21a and 21b of the second electronic board 40B. Then, the first electronic board 30B is pressed against the upper surface of the support plate 20B so that an excessive amount of the applied filler 25 is leaked out through the through hole 36.

Terminal connection lands 37a are provided in one longer-side edge area of the outer surface of the first electronic board 30B, whereas terminal connection lands 37b are provided in the other longer-side edge area, which is opposite to the longer-side edge area in which the board-to-board connection lands 37a are provided.

One end of each of the bonding wires 53a is connected to a corresponding one of the terminal connection lands 37a, whereas the other end of each of the bonding wires 53a is connected to a corresponding one of the external connection terminals 52a.

One end of each of the bonding wires 53b is connected to a corresponding one of the terminal connection lands 37b, whereas the other end of each of the bonding wires 53b is connected to a corresponding one of the external connection terminals 52b.

A board-to-board connector 38c provided on the outer surface of the first electronic board 30B and a board-to-board connector 48c provided on the outer surface of the second electronic board 40B are connected to each other by the flexible cable 27c which passes through the boundary slit 22c.

Alternatively, any one of the board-to-board connectors 38c and 48c may be omitted. In this case, an end of the flexible cable 27c is directly soldered.

As the flexible cable 27c, any one of a flat cable and a flexible board, which are commonly known, can be used.

Further alternatively, two flexible cables which pass respectively through the left boundary slit 22a and the right boundary slit 22c may be used as the flexible cable so as to electrically connect the first electronic board 30B and the second electronic board 40B to each other.

A structure in which the heat-generating components 32 and 42 are mounted is the same as that illustrated in FIG. 7. Moreover, the solder outflow-preventing wall 82 for the soldering land 81 and the solder outflow-preventing wall 85 for the soldering land 84 are the same as those illustrated in FIG. 8.

Figure 11:
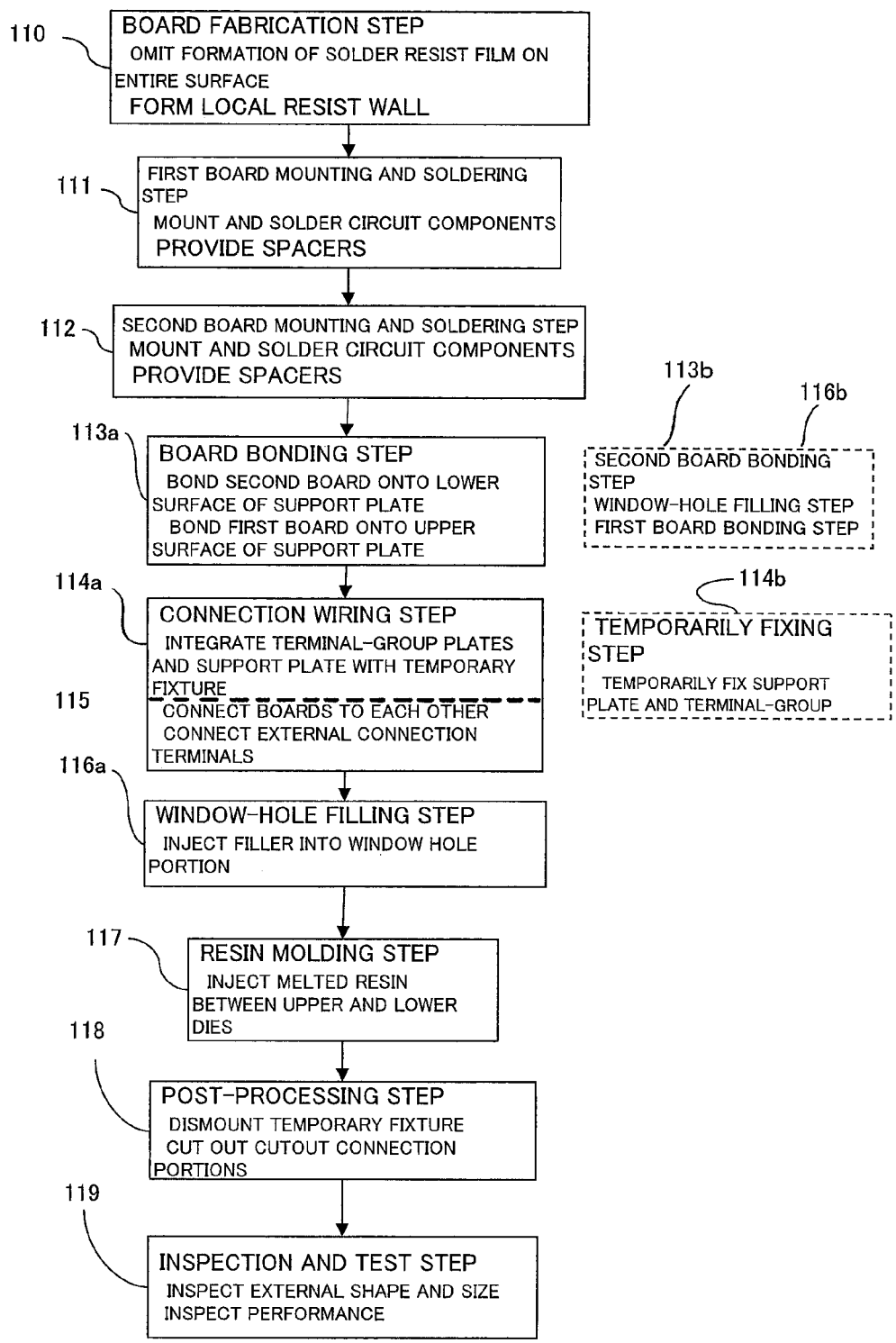
FIG. 11 is a flow chart illustrating a procedure of fabricating the resin-sealed electronic control device illustrated in FIG. 1.

In a method of fabricating the electronic control device 10B according to the second embodiment, in the connection wiring step 115 illustrated in FIG. 11, the board-to-board connectors 38c and 48c are connected to each other by the flexible cable 27c.

Moreover, the bonding pads are soldered onto the terminal connection lands 37a and 37b of the first electronic board 30B. The bonding pads and the external connection terminals 52a and 52b are connected to each other by the bonding wires 53a and 53b.

The remaining structure is the same as that of the first embodiment.

According to the electronic control device 10B of this second embodiment, the support plate 20B is provided with the boundary slit 22a formed in the boundary area between the exposed retaining portion 26a and the position where the exterior covering material 11 is provided and the boundary slit 22c formed in the boundary area between the exposed retaining portion 26b and the position where the exterior covering material 11 is provided. On the side of the first electronic board 30B, which is parallel to the boundary slits 22a and 22c, the board-to-board connector 38c is provided. On the side of the second electronic board 40B, which is parallel to the boundary slits 22a and 22c and opposed to the side of the first electronic board 30B where the board-to-board connector 38c is provided, the board-to-board connector 48c is provided. The first electronic board 30B and the second electronic board 40B are connected to each other by the flexible cable 27c. At the same time, the plurality of terminal connection lands 37a and 37b are arranged on the two opposite sides of the first electronic board 30B, which are perpendicular to the boundary slits 22a and 22c, so as to be connected to the external connection terminals 52a and 52b.

The flexible cable 27c passes through the boundary slit 22c. As a result, the connection wire is not exposed in the boundary area. Thus, the exterior covering material 11 and the support plate 20B can be prevented from being separated from each other at the boundary between the exterior covering material 11 and the support plate 20B.

The other functions and effects of the electronic control device 10B according to the second embodiment are the same as those of the first embodiment, and the description thereof is herein omitted.

Third Embodiment

Figure 17:
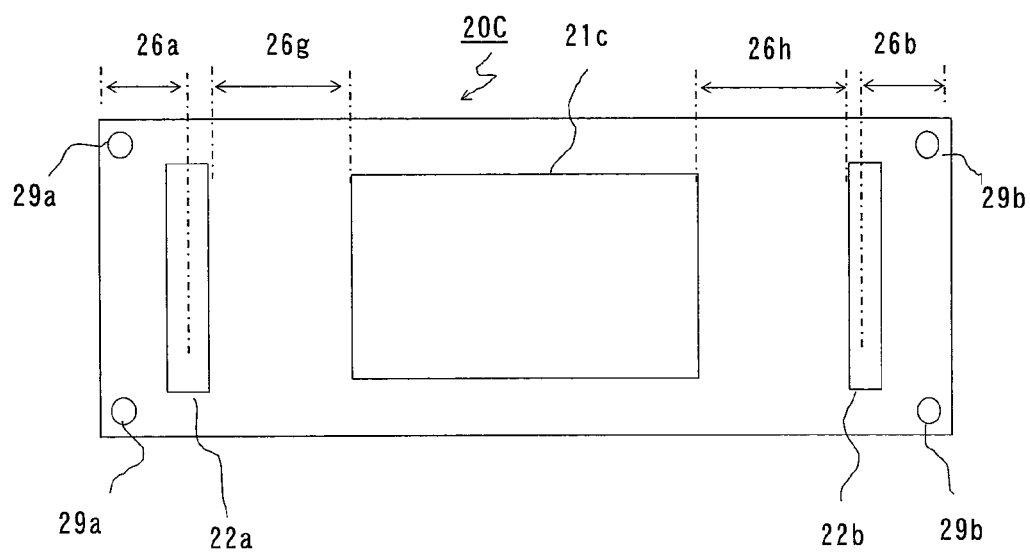
FIG. 17 is a plan view illustrating a support plate of an resin-sealed electronic control device according to a third embodiment of the present invention.
Figure 18:
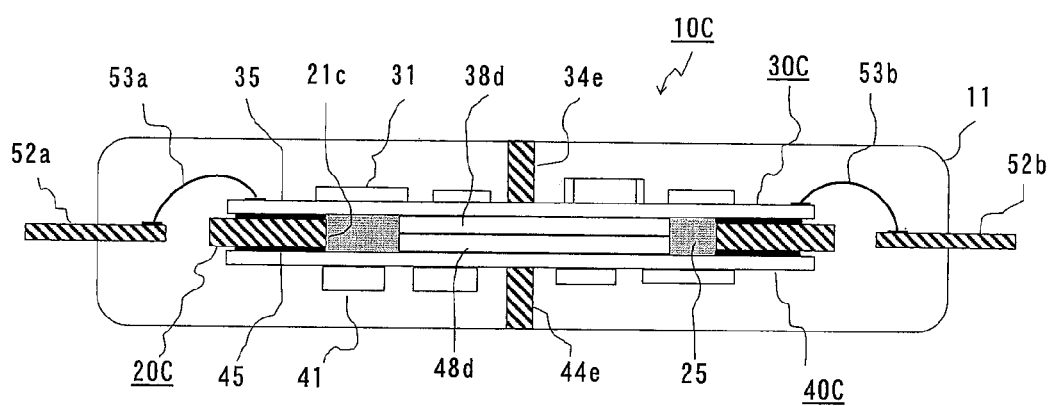
FIG. 18 is a sectional view illustrating the resin-sealed electronic control device, cut along a lateral direction of the support plate.
Figure 19:
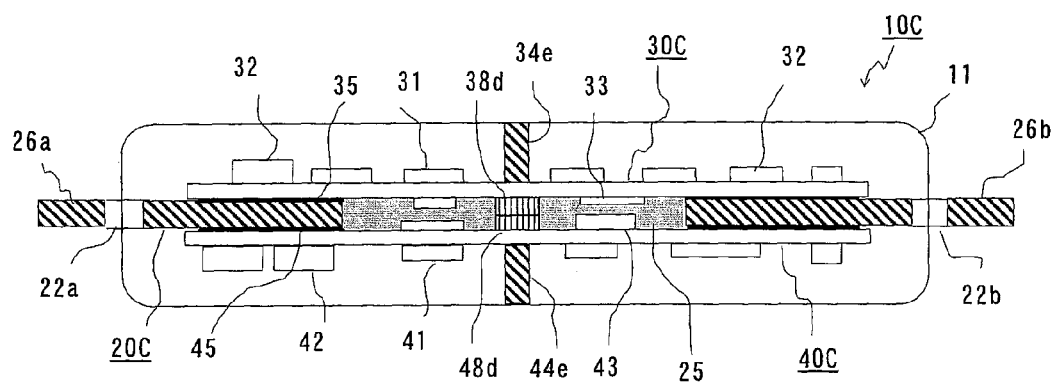
FIG. 19 is a sectional view of the resin-sealed electronic control device, cut along a longitudinal direction of the support plate of FIG. 17.
Figure 20A:
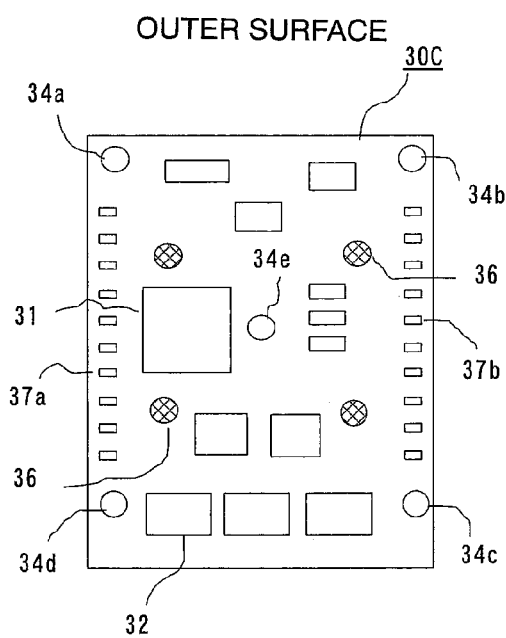
FIG. 20A is a view illustrating an outer surface of a first electronic board of the resin-sealed electronic control device in FIG. 18.
Figure 20B:
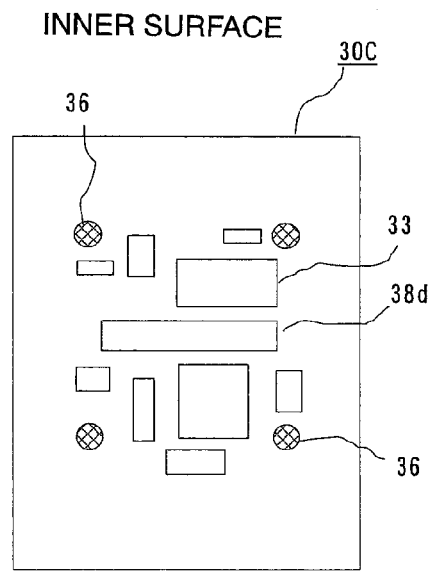
FIG. 20B is a view illustrating an inner surface of the first electronic board.
Figure 21A:
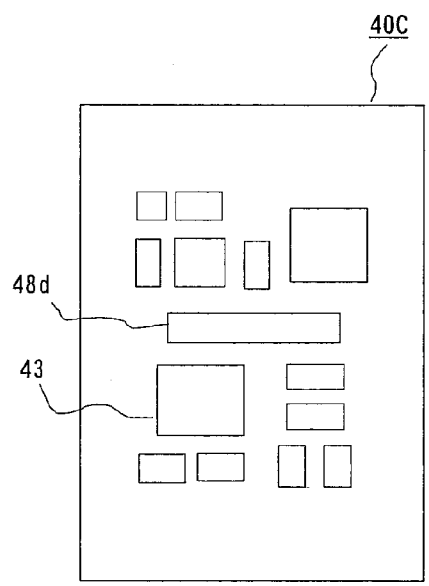
FIG. 21A is a view illustrating an inner surface of a second electronic board of the resin-sealed electronic control device in FIG. 18.
Figure 21B:
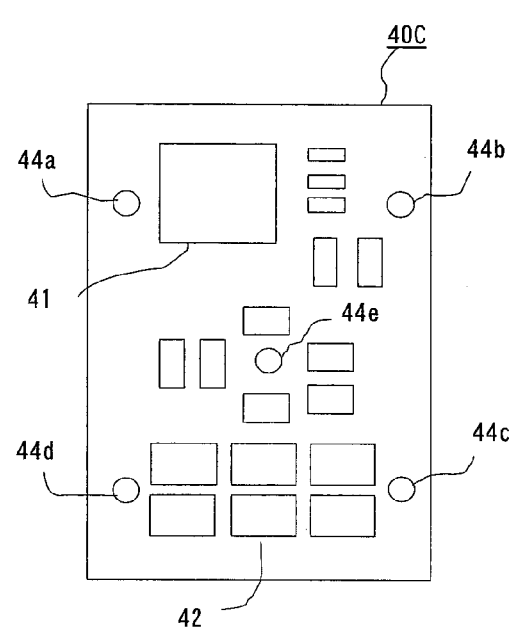
FIG. 21B is a view illustrating an outer surface of the second electronic board.

FIG. 17 is a plan view illustrating a support plate 20C of an electronic control device 10C according to a third embodiment of the present invention. FIG. 18 is a sectional view illustrating the electronic control device 10C, cut along a lateral direction of the support plate 20C. FIG. 19 is a sectional view of the electronic control device 10C, cut along a longitudinal direction of the support plate 20C of FIG. 17. FIG. 20A is a view illustrating an outer surface of a first electronic board 30C of the electronic control device 10C, whereas FIG. 20B is a view illustrating an inner surface of the first electronic board 30C. FIG. 21A is a view illustrating an inner surface of a second electronic board 40C of the electronic control device 10C, whereas FIG. 21B is a view illustrating an outer surface of the second electronic board 40C.

The electronic control device 10C includes: the support plate 20C; the first electronic board 30C; the second electronic board 40C; the plurality of external connection terminals 52a and 52b; and the exterior covering material 11. The support plate 20B is a thermally conductive metal plate member. The first electronic board 30C is bonded to be fixed to an upper surface of the support plate 20C, whereas the second electronic board 40C is bonded to be fixed to a lower surface of the support plate 20C. The first electronic board 30C and the second electronic board 40C are connected to each other through an intermediation of a board-to-board connector 38d and 48d which is a board-to-board connection wiring. The plurality of external connection terminals 52a and 52b are connected to the first electronic board 30C through an intermediation of the bonding wires 53a and 53b. The exterior covering material 11 made of a thermosetting resin entirely covers the first electronic board 30C, the second electronic board 40C, and the board-to-board connector 38d and 48d and partially covers the support plate 20C and the plurality of external connection terminals 52a and 52b.

Two end portions of the support plate 20C are exposed retaining portions 26a and 26b which are not covered with the exterior covering material 11. The support plate 20C is fixed to a thermally conducive wall body (not shown) through an intermediation of the exposed retaining portions 26a and 26b.

The plurality of external connection terminals 52a are initially connected to each other by a cutout connection portion 51a to constitute a terminal-group plate 50a, whereas the plurality of external connection terminals 52b are initially connected to each other by a cutout connection portion 51b to constitute a terminal-group plate 50b. By cutting out the cutout connection portions 51a and 51b in the final step of assembly, the plurality of external connection terminals 52a and 52b are separated into individual pieces.

The support plate 20C has a window hole portion 21c formed in the center. A boundary slit 22a are formed on the left of the window hole portion 21c, whereas a boundary slit 22b are formed on the right of the window hole portion 21c.

A portion of the support plate 20A, which is situated on the outer side of a center line of the boundary slit 22a, is the exposed retaining portion 26a which is not covered with the exterior covering material 11, whereas a portion of the support plate 20A, which is situated on the outer side of a center line of the boundary slit 22b, is the exposed retaining portion 26b which is not covered with the exterior covering material 11. Mounting holes 29a for mounting and fixing the support plate 20C onto the wall body are formed in the exposed retaining portion 26a, whereas mounting holes 29b for mounting and fixing the support plate 20C onto the wall body are formed in the exposed retaining portion 26b.

A portion between the wiring slit 22a and the window hole portion 21c located in the center of the support plate 20A is a plane portion 26g, whereas a portion between the wiring slit 22b and the window hole portion 21c is a plane portion 26h. Heat-generating components 32 are mounted on outer surfaces of areas of the first electronic board 30C, the areas being respectively opposed to upper surfaces of the plane portions 26g and 26h, whereas heat-generating components 42 are mounted on outer surfaces of areas of the second electronic board 40C, the areas being respectively opposed to lower surfaces of the plane portions 26g and 26h.

The first electronic board 30C is bonded to be fixed onto an upper surface of the support plate 20C by an adhesive 35, whereas the second electronic board 40C is bonded to be fixed onto a lower surface of the support plate 20C by an adhesive 45. Each of the first electronic board 30C and the second electronic board 40C is, for example, a glass epoxy board.

The first electronic board 30C is a double-sided mounting board. As illustrated in FIG. 20A, a plurality of outer circuit components 31 are soldered onto soldering lands provided on an outer surface of the first electronic board 30C. A plurality of inner circuit components 33 are soldered onto soldering lands provided on an inner surface of the first electronic board 30C.

On an inner surface of the first electronic board 30C, a board-to-board connector 38d is provided.

The inner circuit components 33 and the board-to-board connector 38d mounted on the inner surface of the first electronic board 30C, the inner surface being a surface to be bonded to the support plate 20C, are housed in the window hole portion 21c of the support plate 20C.

The second electronic board 40C is a double-sided mounting board. As illustrated in FIG. 21B, the plurality of outer circuit components 41 are soldered onto soldering lands provided on an outer surface of the second electronic board 40C. In addition, as illustrated in FIG. 20A, the plurality of inner circuit components 43 are soldered onto soldering lands provided on an inner surface of the second electronic board 40C.

A board-to-board connector 48d is provided on the inner surface of the second electronic board 40C.

The inner circuit components 43 and the board-to-board connector 48d which are mounted on the inner surface of the second electronic board 40C, the inner surface being a surface to be bonded to the support plate 20C, are housed in the window hole portion 21c of the support plate 20C.

The pair of board-to-board connectors 38d and 48d, which are coupled to each other, are located at the center of the window hole portion 21c. A height size of the combination of the board-to-board connectors 38d and 48d coupled to each other is equal to a size of a gap between the first electronic board 30C and the second electronic board 40C.

First spacers 34a, 34b, 34c, and 34d are fixed by soldering in the four corners of the first electronic board 20C, as illustrated in FIG. 5A. A first spacer 34e is fixed by soldering in the center of the first electronic board 30C.

Each of the first spacers 34a to 34e passes through the exterior covering material 11 so that a distal end surface of each is externally exposed.

Similarly, second spacers 44a, 44b, 44d, and 44d are fixed by soldering at four positions on the second electronic board 40C, as illustrated in FIG. 21B. A second spacer 44e is fixed by soldering in the center of the second electronic board 40C.

Each of the second spacers 44a to 44e passes through the exterior covering material 11 so that a distal end surface of each is externally exposed.

The spacers 34a to 34e, 44a to 44e, and board-to-board connectors 38d and 48d coupled to each other serve as reinforcing members for preventing the first electronic board 30C and the second electronic board 40C from being deformed at the time of heat-molding of the exterior covering material 11.

The window hole portion 21c of the support plate 20C is filled with a filler 25. The filler 25 is a viscous fluid potting resin material injected into the window hole portion 21c through a through hole 36 formed in the first electronic board 30C.

As a method of filling the filler 25, the following method may be used. The second electronic board 40C is first bonded to be fixed onto the lower surface of the support plate 20C. Subsequently, an appropriate amount of the filler 25 is applied to the window hole portion 21c of the second electronic board 40C. Then, the first electronic board 30C is pressed against the upper surface of the support plate 20C so that an excessive amount of the applied filler 25 is leaked out through the through hole 36.

Board-to-board connection lands 37a are provided in one longer-side edge area of the outer surface of the first electronic board 30C, whereas board-to-board connection lands 37b are provided in the other longer-side edge area, which is opposite to the longer-side edge area in which the board-to-board connection lands 37a are provided.

One end of each of the bonding wires 53a is connected to a corresponding one of the terminal connection lands 37a, whereas the other end of each of the bonding wires 53a is connected to a corresponding one of the external connection terminals 52a.

One end of each of the bonding wires 53b is connected to a corresponding one of the terminal connection lands 37b, whereas the other end of each of the bonding wires 53b is connected to a corresponding one of the external connection terminals 52b.

In the electronic control device 10C according to the third embodiment, the first electronic board 30C and the second electronic board 40C are directly connected to each other by the board-to-board connectors 38d and 48d in the connection wiring step 115 illustrated in FIG. 11.

Moreover, the bonding pads are soldered onto the terminal connection lands 37a and 37b provided on the first electronic board 30C. The bonding pads and the external connection terminals 52a and 52b are connected to each other by the bonding wires 53a and 53b.

For example, an aluminum thin wire is used as each of the bonding wires. The bonding wires may also be directly connected to the wiring pattern without soldering the bonding pads.

The remaining part of the method of fabricating the electronic control device 10C is the same as the method of fabricating the electronic control device 10A described in the first embodiment, and the description thereof is herein omitted.

According to the electronic control device 10C of this third embodiment, the support plate 20C is provided with the boundary slit 22a formed in the boundary area between the exposed retaining portion 26a and the position where the exterior covering material 11 is provided and the boundary slit 22b formed in the boundary area between the exposed retaining portion 26b and the position where the exterior covering material 11 is provided. The board-to-board connector 38d is provided on the inner surface of the first electronic board 30C, whereas the board-to-board connector 48d is provided on the inner surface of the second electronic board 40C, which is opposed to the inner surface of the first electronic board 30C. The board-to-board connectors 38d and 48d are located at the center position of the window hole portion 21c of the support plate 20C while the size of the combination of the board-to-board connectors 38d and 48d is equal to the size of the gap between the first electronic board 30C and the second electronic board 40C. As a result, the board-to-board connectors 38d and 48d also serve as spacers for preventing a change in size of the gap between the first electronic board 30C and the second electronic board 40C. On the pair of opposite sides of the first electronic board 30C, which are perpendicular to the boundary slits 22a and 22b, the plurality of terminal connection lands 37a and 37b are arranged so as to be connected to the external connection terminals 52a and 52b.

As described above, the board-to-board connector 38d is provided on the inner surface of the first electronic board 30C, whereas the board-to-board connector 48d is provided on the inner surface of the second electronic board 40C, which is opposed to the inner surface of the first electronic board 30C. Therefore, the wiring slits for the connection between the first electronic board 30C and the second electronic board 40C are not required to be provided in the support plate 20C. In addition, the third spacer for preventing a change in size of the gap between the first electronic board 30C and the second electronic board 40C due to deformation is not required.

The remaining part of the method of fabricating the electronic control device 10C is the same as the method of fabricating the electronic control device 10A described in the first embodiment, and the description thereof is herein omitted.

In the electronic control devices 10A to 10C according to the first to third embodiments described above, each of the first electronic boards 30A, 30B, and 30C and the second electronic boards 40A, 40B, and 40C has been described as the epoxy resin board having the two mounting surfaces. In addition, in the examples described above, the heat-generating components 32 and 42 are mounted on both of the first electronic board and the second electronic board. However, the present invention is also applicable to the case where, for example, the first electronic board 30A, 30B, or 30C is a multilayered high-density double mounting board without carrying the heat-generating components 32 and 42 and the second electronic board 40A, 40B, or 40C is a single-sided mounting board having a surface on which the heat-generating components 32 or 42 are mounted.

The epoxy resin board is used as each of the electronic boards in the embodiments described above. However, if a ceramic board is used in place of the epoxy resin board, a smaller resin-sealed electronic control device with higher heat conduction performance for the heat-generating components, which enables the mounting at a higher density, can be obtained.

The plane portions 26c and 26d of the support plate 20A, the plane portions 26e and 26f of the support plate 20B, and the plane portions 26g and 26h of the support plate 20C, to which the heat-generating components 32 and 42 are located in close proximity, may be located on any of the four sides of the window hole portion 21, 21a, 21b, or 21c.

Although the exposed retaining portions 26a and 26b are formed in the left area and the right area of each of the support plates 20A to 20C in the electronic control devices 10A to 10C according to the first to third embodiments, the exposed retaining portion may be formed in any one of the left area and the right area of the support plate.

In the support plate 20A according to the first embodiment and the support plate 20C according to the third embodiment, one boundary slit may be provided. In this case, one wiring slit may be provided in parallel to the boundary slit.

In the support plate 20B according to the second embodiment, the number of boundary slits may be one.

The structure in which the heat-generating components 32 and 42 are mounted according to the second and third embodiments is the same as that illustrated in FIG. 7. Moreover, the structure of the solder outflow-preventing wall 82 for the soldering land 81 and that of the solder outflow-preventing wall 85 for the soldering land 84 are the same as those illustrated in FIG. 8.

Although each of the electronic control devices 10A to 10C according to the first to third embodiments has been described taking the transmission control device for the automobile transmission as an example, it is apparent that the electronic control device of the present invention is not limited thereto.

For example, the present invention is applicable to a drive control device for a radiator fan of a water-cooled automobile engine control device and an intake air amount detection control device for an automobile engine control device.

What is claimed is:

1. A resin-sealed electronic control device, comprising:
a first electronic board and a second electronic board, each carrying a plurality of circuit components mounted thereon and each being electrically connected to a plurality of external connection terminals;
a thermally conductive support plate comprising an upper surface and a lower surface, on which the first electronic board and the second electronic board are respectively bonded to be fixed; and
an exterior covering material obtained by entirely covering the first electronic board and the second electronic board and partially covering the plurality of external connection terminals and the support plate with a synthetic resin, wherein:
the support plate comprises:
a window hole portion to be filled with a viscous fluid filler; and
an exposed retaining portion formed on at least one of two sides of the window hole portion to be externally exposed;
the plurality of circuit components are mounted on both an upper surface and a lower surface of at least one of the first electronic board and the second electronic board, and one of the first electronic board and the second electronic board comprises a through hole for filling the window hole portion with the filler; and
the first electronic board and the second electronic board respectively comprise peripheral edge portions on inner surfaces, which are respectively bonded to be fixed to the upper surface and the lower surface of the support plate by adhesives, and inner circuit components mounted on the inner surface of at least one of the first electronic board and the second electronic board are housed in the window hole portion.

2. A resin-sealed electronic control device according to claim 1, wherein:
the support plate comprises plane portions in a peripheral area of the window hole portion, the plane portions being applied with the adhesives having thermal conductivity;
the first electronic board and the second electronic board are fixed through an intermediation of the adhesives, and heat-generating components mounted on an outer surface of at least one of the first electronic board and the second electronic board are mounted in areas of the outer surface respectively opposed to the plane portions; and
the exposed retaining portion of the support plate is fixed to a thermally conductive body.

3. A resin-sealed electronic control device according to claim 1, wherein:
the support plate comprises one window hole portion;
the first electronic board comprises an outer surface on which first spacers are provided vertically, whereas the second electronic board comprises an outer surface on which second spacers are provided vertically;
a third spacer comprising two end surfaces respectively abutting against the inner surface of the first electronic board and the inner surface of the second electronic board is arranged in the one window hole portion; and
the first spacers and the second spacers comprise distal end surfaces brought into abutment against inner wall surfaces of dies when the synthetic resin is injected between the dies for pressure-molding of the exterior covering material.

4. A resin-sealed electronic control device according to claim 1, wherein:
the support plate comprises a plurality of window hole portions;
the first electronic board comprises an outer surface on which first spacers are provided vertically, whereas the second electronic board comprises an outer surface on which second spacers are provided vertically;
a partition wall formed between the plurality of window hole portions adjacent to each other serves as a third spacer comprising two surfaces respectively abutting against the inner surface of the first electronic board and the inner surface of the second electronic board; and
the first spacers and the second spacers comprise distal end surfaces brought into abutment against inner wall surfaces of dies when the synthetic resin is injected between the dies for pressure-molding of the exterior covering material.

5. A resin-sealed electronic control device according to claim 1, wherein:
the support plate comprises at least one boundary slit formed in a boundary area between the exposed retaining portion and the exterior covering material, and comprises at least one wiring slit formed in parallel to the boundary slit;
a plurality of board-to-board connection lands are arranged on at least one of a pair of opposite sides, which are parallel to the wiring slit, of each of the first electronic board and the second electronic board, and the first electronic board and the second electronic board are connected to each other by bonding wires, each having two ends respectively connected to a corresponding one of the plurality of board-to-board connection lands provided on the first electronic board and a corresponding one of the plurality of board-to-board connection lands provided on the second electronic board; and a plurality of terminal connection lands are arranged on at least one of a pair of opposite sides, which are perpendicular to the wiring slit, of at least one of the first electronic board and the second electronic board, and the plurality of terminal connection lands and the plurality of external connection terminals are connected to each other through an intermediation of connection wires.

6. A resin-sealed electronic control device according to claim 1, wherein:
the support plate comprises at least one boundary slit formed in a boundary area between the exposed retaining portion and the exterior covering material;
a board-to-board connector is provided on at least one of a pair of opposite sides, which are parallel to the boundary slit, of each of the first electronic board and the second electronic board, and the first electronic board and the second electronic board are connected to each other by a flexible cable having two ends respectively connected to the board-to-board connector provided on the first electronic board and the board-to-board connector provided on the second electronic board; and
a plurality of terminal connection lands are arranged on at least one of a pair of opposite sides, which are perpendicular to the boundary slit, of at least one of the first electronic board and the second electronic board, and the plurality of terminal connection lands and the plurality of external connection terminals are connected to each other through an intermediation of connection wires.

7. A resin-sealed electronic control device according to claim 1, wherein:
the support plate comprises at least one boundary slit formed in a boundary area between the exposed retaining portion and the exterior covering material;
the first electronic board and the second electronic board respectively comprise inner surfaces opposed to each other, on which a pair of board-to-board connectors are respectively provided, and a size of a combination of the board-to-board connectors is equal to a size of a gap between the first electronic board and the second electronic board; and
a plurality of terminal connection lands are arranged on at least one of a pair of opposite sides, which are perpendicular to the boundary slit, of at least one of the first electronic board and the second electronic board, and the plurality of terminal connection lands and the plurality of external connection terminals are connected to each other through an intermediation of connection wires.

8. A resin-sealed electronic control device according to claim 5, wherein:
the plurality of terminal connection lands are provided on the first electronic board; and
the second electronic board is connected to the first electronic board through an intermediation of one of the bonding wires, the flexible cable, and the pair of board-to-board connectors, and is connected to the plurality of external connection terminals through the plurality of terminal connection lands and the connection wires.

9. A method of fabricating the resin-sealed electronic control device according to claim 1, comprising a resin molding step of injecting the melted synthetic resin between dies for pressure-molding of the exterior covering material after connecting the first electronic board and the second electronic board to each other, connecting the plurality of external connection terminals, filling the window hole portion with the filler to then heat and cure the filler.

10. A method of fabricating the resin-sealed electronic control device according to claim 9, further comprising:
a board mounting step of mounting and soldering the plurality of circuit components onto the first electronic board and the second electronic board;
a board bonding step of fixing the peripheral edge portion of the first electronic board and the peripheral edge portion of the second electronic board respectively onto the upper surface and the lower surface of the support plate by the adhesives made of a thermosetting resin;
a connection wiring step of temporarily fixing and integrating terminal-group plates each comprising the plurality of external connection terminals connected to each other, and the support plate onto which the first electronic board and the second electronic board are fixed together, connecting the first electronic board and the second electronic board to each other, and connecting the plurality of external connection terminals;
a window-hole filling step performed after the board bonding step, in which the viscous fluid filler made of a thermosetting resin is injected into the window hole portion through the through hole or the viscous fluid filler made of the thermosetting resin is applied to the window hole portion after bonding the second electronic board onto the lower surface of the support plate to be fixed thereto, and the first electronic board is subsequently bonded onto the upper surface of the support plate, to thereby leak out the filler from the through hole; and
a post-processing step of cutting out a cutout connection portion of each of the terminal-group plates after the resin molding step.

11. A method of fabricating the resin-sealed electronic control device according to claim 9, further comprising a board fabrication step of fabricating the first electronic board and the second electronic board,
wherein the board fabrication step comprises a preventing wall forming step of forming a solder outflow-preventing wall for preventing a melted solder from flowing out on each of the first electronic board and the second electronic board, the solder outflow-preventing wall being formed of one of a solder resist film and by silk-screen printing to be provided between a soldering land to which the plurality of circuit components are connected and one of a plane pattern and a wiring pattern each being in connection with the soldering land.

* * * * *